US012750024B2

(12) United States Patent
Itoi

(10) Patent No.: US 12,750,024 B2
(45) Date of Patent: Sep. 29, 2026

(54) METHODS AND APPARATUS TO DETERMINE A BIAS CURRENT OF AN AMPLIFIER

(71) Applicant: Texas Instruments Incorporated, Dallas, TX (US)

(72) Inventor: Ichiro Itoi, Tuscon, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 666 days.

(21) Appl. No.: 18/129,635

(22) Filed: Mar. 31, 2023

(65) Prior Publication Data

US 2024/0333239 A1 Oct. 3, 2024

(51) Int. Cl.
*H03F 3/45* (2006.01)

(52) U.S. Cl.
CPC ..... *H03F 3/45475* (2013.01); *H03F 3/45977* (2013.01); *H03F 2203/45138* (2013.01)

(58) Field of Classification Search
None
See application file for complete search history.

(56) References Cited

U.S. PATENT DOCUMENTS 5,008,634 A * 4/1991 Christian ................ H03G 7/08 330/306
8,243,956 B2 * 8/2012 Turnbull ................ H04R 3/00 330/297

OTHER PUBLICATIONS

Lewis, Don; "Compensation of Linear IC Test Loops," Electronic Test, Benwill Publishing, pp. 84-85, May 1979, 4 pages.
Lewis, Don, "Testing Operational Amplifliers hot to use the basic op amp test loop," Electronic Test, Benwill Publishing, pp. 76-82, Jan. 1979, 9 pages.
Texas Instruments, "Real World Signal Processing—Input Bias Current Test Circuit Charge accumulation," retrieved from [https://slideplayer.com/slide/12933506/78/images/31/input+bias+test+circuit+Charge+accumulation.jpg] on Mar. 30, 2023, 1 page.

* cited by examiner

*Primary Examiner* — Andrea Lindgren Baltzell
*Assistant Examiner* — Malane Lieng
(74) *Attorney, Agent, or Firm* — Xianghui Huang; Frank D. Cimino

(57) ABSTRACT

An example apparatus includes: an amplifier having an input and an output; feedback circuitry having a first terminal and a second terminal, the first terminal of the feedback circuitry directly connected to the input of the amplifier, the second terminal of the feedback circuitry directly connected to the output of the amplifier; voltage divider circuitry having a first terminal and a second terminal, the first terminal of the voltage divider circuitry directly connected to the output of the amplifier; and a capacitor having a terminal directly connected to the second terminal of the voltage divider circuitry.

24 Claims, 14 Drawing Sheets

METHODS AND APPARATUS TO DETERMINE A BIAS CURRENT OF AN AMPLIFIER

TECHNICAL FIELD

This description relates generally to amplifiers and, more particularly, to methods and apparatus to determine a bias current of an amplifier.

BACKGROUND

As electronics continue to become increasingly complex, designers continue to develop increasingly complex circuitry. While developing such circuitry, electronic designers use measurement circuitry to determine electrical characteristics of components. One such electrical characteristic is input bias current, which is a direct current that an amplifier uses when supply inputs are coupled to power. The input bias current results from a combination of gate current and leakage current within the amplifier. Gate current is a relatively small current needed to support internal circuitry, whereas leakage current is also a relatively small current resulting from electrostatic discharge circuitry and other terminals. An input bias current measurement may be used to determine the input bias current of a device under test (DUT), such as an amplifier.

SUMMARY

For methods and apparatus to determine a bias current of an amplifier, an example apparatus includes an amplifier having an input and an output; feedback circuitry having a first terminal and a second terminal, the first terminal of the feedback circuitry directly connected to the input of the amplifier, the second terminal of the feedback circuitry directly connected to the output of the amplifier; voltage divider circuitry having a first terminal and a second terminal, the first terminal of the voltage divider circuitry directly connected to the output of the amplifier; and a capacitor having a terminal directly connected to the second terminal of the voltage divider circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
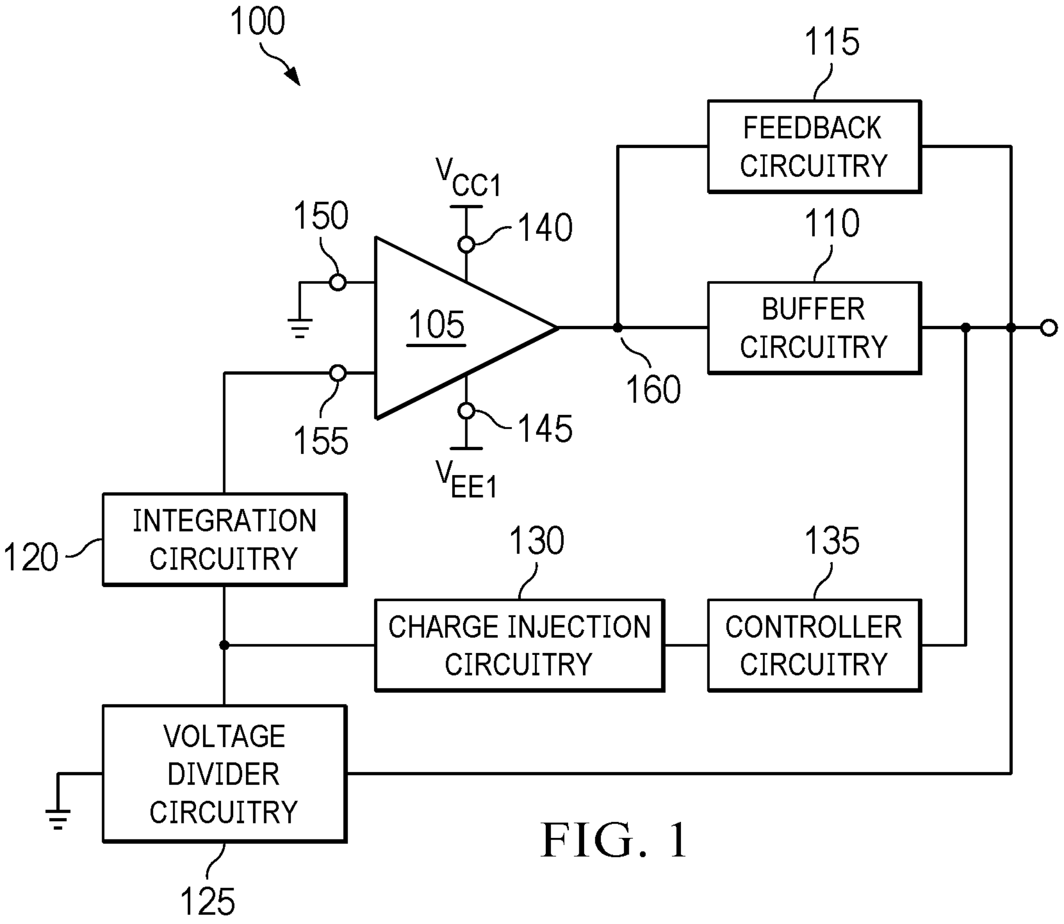
FIG. 1 is a block diagram of example measurement circuitry to measure a bias current of an amplifier.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

As electronics continue to become increasingly complex, designers continue to develop increasingly complex circuitry. Some such increasingly complex circuitry are improved versions of previous circuitry, such as improving an amplifier design. As improvements are made, designers use measurement circuitry to determine electrical characteristics and confirm improvements to circuitry. In some applications, measurement circuitry may be a part of a manufacturing process to ensure electrical characteristics of a component satisfy design specifications. With continuing improvements to electrical components, designers are incentivized to develop increasingly precise measurement circuitry.

In some applications, measurement circuitry determines a bias current of an amplifier using voltage measurements. A bias current is a direct current that an amplifier uses to operate. In some circuitry, including amplifier circuitry, the bias current may be a combination of a gate current and a leakage current. The gate current is a relatively small current needed to support internal circuitry, whereas the leakage current is also a relatively small current resulting from electrostatic discharge circuitry and loss at other terminals. A bias current measurement may be used to determine the input bias current of a test device, such as an amplifier.

One method of determining a bias current of an input of an amplifier involves using a capacitor and a negative feedback loop. The bias current is determined based on a change in voltage across the capacitor over time. Although relatively simple, a common mode voltage of the amplifier under test increases as the voltage across the capacitor increases. Such a dependency on the common mode voltage results in unstable measurements that decreases an accuracy of a determined bias current.

Another method of determining a bias current at an input of an amplifier involves using an additional amplifier and a capacitor as integration circuitry. The bias current is determined based on a change in voltage across the capacitor over time. The additional amplifier stabilizes a common mode voltage of the amplifier under test. However, errors resulting from the integration circuitry and/or current leakage of a wire or electrical trace between the amplifier under test and the integration circuitry have to be considered in the bias current calculation. Determining such errors is relatively complex in comparison to calculating the bias current.

Examples described herein include measurement circuitry to determine a bias current of an amplifier using buffer circuitry, feedback circuitry, and integration circuitry. In some described examples, the feedback circuitry controls gain-bandwidth of the buffer circuitry. The buffer circuitry stabilizes the common mode voltage of the amplifier under test. The integration circuitry is directly coupled to an input of the amplifier. The integration circuitry is coupled to the buffer circuitry by voltage divider circuitry. The voltage divider circuitry and the integration circuitry create a closed loop configuration of the amplifier under test. Creating a closed-loop circuit using the integration circuitry results in a self-integration functionality. Controller circuitry calculates the bias current based on a change in voltage across a capacitor of the integration circuitry over time, the capacitance of the capacitor, and the gain of the voltage divider. Advantageously, a closed loop configuration of the amplifier under test reduces error from an integration of the bias current.

In some described examples, switches reset and/or initialize the measurement circuitry. In some examples, the controller circuitry controls a plurality of switches to reset and/or initialize the measurement circuitry by setting voltages approximately equal to each other. In other examples, the controller circuitry initializes the measurement circuitry by causing a charge injector to supply additional charge to the capacitor. Advantageously, using switches to reset and/or initialize the measurement circuitry reduces variations in the voltage across the capacitor. Advantageously, supplying additional charges to the capacitor reduces variations in an output voltage.

FIG. 1 is a block diagram of example measurement circuitry 100 to measure a bias current of an example amplifier 105. In the example of FIG. 1, the measurement circuitry 100 includes the amplifier 105, example buffer circuitry 110, example feedback circuitry 115, example integration circuitry 120, example voltage divider circuitry 125, example charge injection circuitry 130, and example controller circuitry 135. The measurement circuitry 100 determines a bias current of the amplifier 105 based on an output voltage of the buffer circuitry 110, a capacitance of the integration circuitry 120, and a gain of the voltage divider circuitry 125.

In the example of FIG. 1, the amplifier 105 has a first terminal, a second terminal, a first input, a second input, and an output. The first terminal of the amplifier 105 is coupled to a first example reference terminal 140. The second terminal of the amplifier 105 is coupled to a second example reference terminal 145. The first input of the amplifier 105 is coupled to a third example reference terminal 150. The second input of the amplifier 105 is coupled to a fourth example reference terminal 155. The output of the amplifier 105 is coupled to a fifth example reference terminal 160. In some examples, the output of the amplifier 105 is coupled to a register (not illustrated) to reduce oscillations on the output of the amplifier 105. The amplifier 105 may be referred to as a device under test or an amplifier under test.

The first reference terminal 140 supplies a first reference voltage ($V_{CC1}$) to the amplifier 105. The second reference terminal 145 supplies a second reference voltage ($V_{EE1}$) to the amplifier 105. The reference voltages may vary depending on the amplifier 105.

In some examples, the amplifier 105 may be replaced to test input bias currents of additional amplifiers. For example, a designer or manufacturer may replace the amplifier 105 to test a plurality of amplifiers. In other examples, conditions in which the amplifier 105 is exposed to may vary to determine bias currents across a range of operating conditions, such as a range of temperatures, a range of reference voltages, etc.

The buffer circuitry 110 has a first terminal coupled to the feedback circuitry 115 and the fifth reference terminal 160. The buffer circuitry 110 has a second terminal coupled to the feedback circuitry 115, the voltage divider circuitry 125, and the controller circuitry 135. The buffer circuitry 110 isolates the first terminal of the buffer circuitry 110 from the second terminal of the buffer circuitry 110. The buffer circuitry 110 buffers signals at the first terminal of the buffer circuitry 110 which increases stability and drive strength of the signals.

The feedback circuitry 115 has a first terminal coupled to the buffer circuitry 110, the voltage divider circuitry 125, and the controller circuitry 135. The feedback circuitry 115 has a second terminal coupled to the buffer circuitry 110 and the fifth reference terminal 160. The feedback circuitry 115 creates a closed loop configuration of the buffer circuitry 110. Advantageously, such a configuration of the buffer circuitry 110 and the feedback circuitry 115 controls a gain-bandwidth of the buffer circuitry 110.

The integration circuitry 120 has a first terminal coupled to the voltage divider circuitry 125 and the charge injection circuitry 130. The integration circuitry 120 has a second terminal coupled to the fourth reference terminal 155. A voltage difference between the first and second terminals of the integration circuitry 120 represents the bias current at the fourth reference terminal 155.

The voltage divider circuitry 125 has a first terminal coupled to the buffer circuitry 110, the feedback circuitry 115, and the controller circuitry 135. The voltage divider circuitry 125 has a second terminal coupled to the integration circuitry 120 and the charge injection circuitry 130. The voltage divider circuitry 125 has a third terminal coupled to a common terminal, which is coupled to a common terminal that provides a common potential (e.g., ground). The voltage divider circuitry 125 amplifies the voltage difference across the integration circuitry 120 by a gain. The voltage divider circuitry 125 closes a loop between the reference terminals 155 and 160. Advantageously, the closed loop configuration between the reference terminals 155 and 160 causes the integration circuitry 120 to be a self-integrator, eliminating the need for an external integrator and the associated shortcomings.

The charge injection circuitry 130 is coupled to the integration circuitry 120, the voltage divider circuitry 125, and the controller circuitry 135. The controller circuitry 135 enables and disables the charge injection circuitry 130. The charge injection circuitry 130 supplies excess charges to the integration circuitry 120 and the voltage divider circuitry 125 when enabled by the controller circuitry 135. Advantageously, the excess charges compensate the integration circuitry 120 for effects of the bias current of the amplifier 105 using charges from the charge injection circuitry 130.

The controller circuitry 135 is coupled to the buffer circuitry 110, the feedback circuitry 115, the voltage divider circuitry 125, and the charge injection circuitry 130. The controller circuitry 135 determines the bias current at the fourth reference terminal 155 based on a change in a voltage at the second terminal of the buffer circuitry 110 (which is coupled to an output terminal, VOUT, of the measurement circuitry 100) over time, a capacitance of the integration circuitry 120, and the gain of the voltage divider circuitry 125. The controller circuitry 135 controls the charge injection circuitry 130. The controller circuitry 135 enables the charge injection circuitry 130 to initialize and/or reset the integration circuitry 120. The controller circuitry 135 disables the charge injection circuitry 130 while determining the bias current at the fourth reference terminal 155. In some examples, the controller circuitry 135 enables the charge injection circuitry 130 for a duration of time to compensate the integration circuitry 120 for charge supplied to the amplifier 105. In such examples, the duration of time may be a predetermined duration.

In some examples, the controller circuitry 135 includes circuitry to provide control signals that enable or control or cause other components of the measurement circuitry, e.g., 100, to operate and perform their intended operations. For example, the controller circuitry 135 provides a control signal to a control terminal of a switch or a transistor in the measurement circuitry 100. Responsive to the control signal the switch opens (is non-conductive) or closes (is conductive) or the transistor transitions to an off state (is non-conductive) or to an on state (is conductive). As such, it can be said that the controller circuitry 135 opens or closes a switch or turns a transistor on or off or couples two or more circuit elements using one or more switches.

Figure 2:
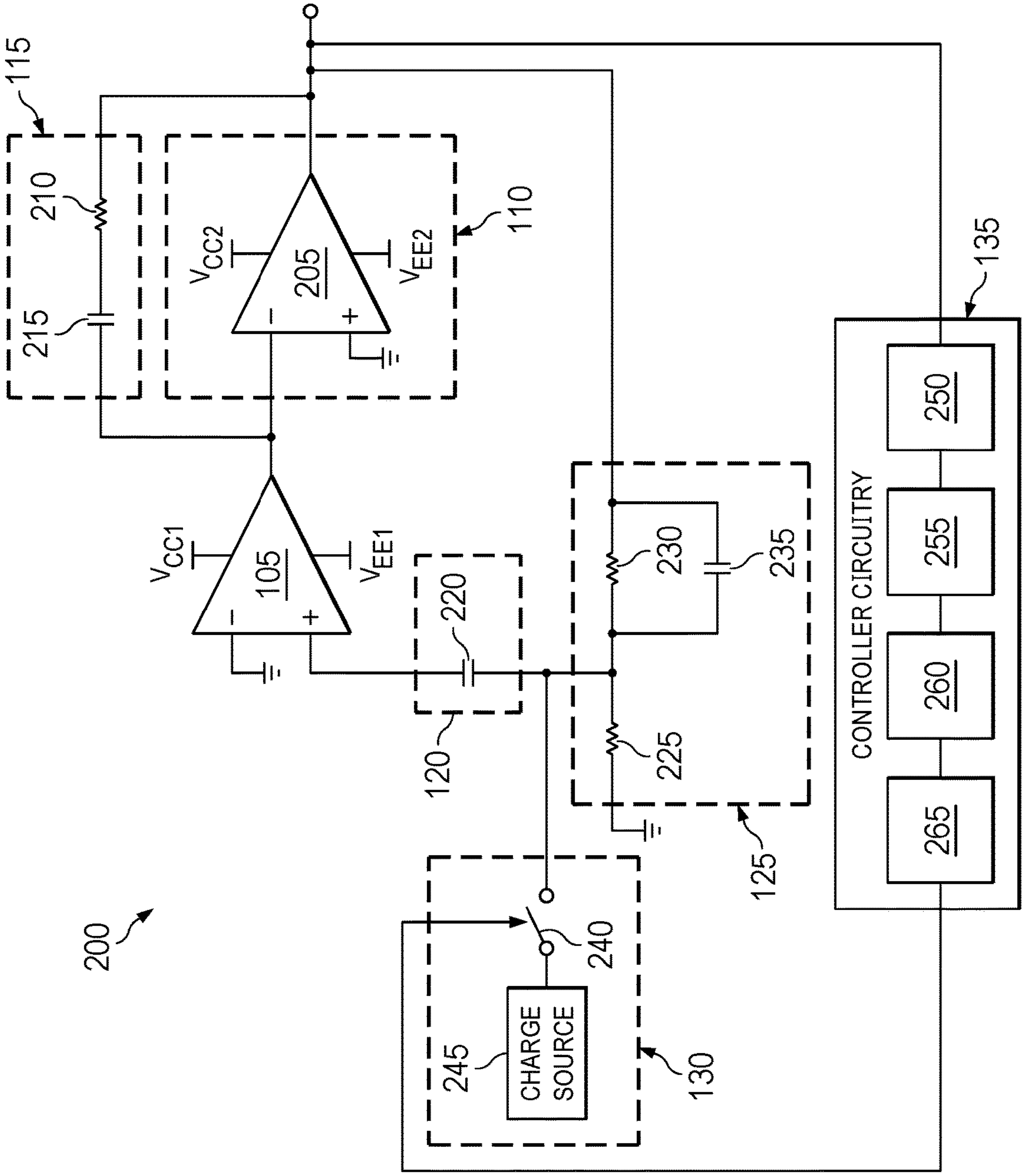
FIG. 2 is a schematic diagram of an example of the measurement circuitry of FIG. 1 to measure an input bias current of a non-inverting input of the amplifier of FIG. 1, the measurement circuitry including charge injection circuitry.

FIG. 2 is a schematic diagram of an example measurement circuitry 200. The measurement circuitry 200 of FIG. 2 is an example of the measurement circuitry 100 of FIG. 1. In the example of FIG. 2, the measurement circuitry 200 includes examples of the amplifier 105, the buffer circuitry 110 of FIG. 1, the feedback circuitry 115 of FIG. 1, the integration circuitry 120 of FIG. 1, the voltage divider circuitry 125 of FIG. 1, the charge injection circuitry 130 of FIG. 1, and example controller circuitry 135 of FIG. 1. In the example of FIG. 2, the amplifier 105 may be referred to as a first amplifier 105. The measurement circuitry 200 determines a bias current of a non-inverting input of the first amplifier 105 based on an output voltage of the buffer circuitry 110, a capacitance of the integration circuitry 120, and a gain of the voltage divider circuitry 125.

The buffer circuitry 110 is coupled to the first amplifier 105, the feedback circuitry 115, the voltage divider circuitry 125, and the controller circuitry 135. In the example of FIG. 2, the buffer circuitry 110 includes a second example amplifier 205. The second amplifier 205 has a first supply input coupled to a first reference voltage ($V_{CC2}$). The second amplifier 205 has a second supply input coupled to a second reference voltage ($V_{EE2}$). The second amplifier 205 has an inverting input coupled to the first amplifier 105 and the feedback circuitry 115. The second amplifier 205 has a non-inverting input coupled to the common terminal that provides the common potential or controlled voltage source. The second amplifier 205 has an output coupled to the feedback circuitry 115, the voltage divider circuitry 125, and the controller circuitry 135.

The feedback circuitry 115 is coupled to the first amplifier 105, the buffer circuitry 110, the voltage divider circuitry 125, and the controller circuitry 135. In the example of FIG. 2, the feedback circuitry 115 includes a first example resistor 210 and a first example capacitor 215. The first resistor 210 has a first terminal coupled to the buffer circuitry 110, the voltage divider circuitry 125, and the controller circuitry 135. The first resistor 210 has a second terminal coupled to the first capacitor 215. The first capacitor 215 has a first terminal coupled to the first resistor 210. The first capacitor 215 has a second terminal coupled to the first amplifier 105 and the buffer circuitry 110.

The first resistor 210 and the first capacitor 215 create a feedback loop from the output of the second amplifier 205 to the inverting input of the second amplifier 205. The feedback circuitry 115 causes the second amplifier 205 to operate as a closed-loop amplifier. In an example operation, the feedback circuitry 115 causes the second amplifier 205 to operate as a buffer. Accordingly, the second amplifier 205 may be referred to as a buffer.

In an example operation, the feedback circuitry 115 controls the gain-bandwidth of the second amplifier 205 to compensate a closed loop that includes the first amplifier 105. Such an example operation stabilizes the output of the second amplifier 205. Advantageously, stabilizing the output of the second amplifier 205 increases an accuracy and precision of bias current measurements.

The integration circuitry 120 is coupled to the first amplifier 105, the voltage divider circuitry 125, and the charge injection circuitry 130. In the example of FIG. 2, the integration circuitry 120 includes a second example capacitor 220. The second capacitor 220 has a first terminal coupled to the non-inverting input of the first amplifier 105. The second capacitor 220 has a second terminal coupled to the voltage divider circuitry 125 and the charge injection circuitry 130. The second capacitor 220 has a capacitance (CAP). A bias current of the first amplifier 105 modifies a voltage difference across the second capacitor 220. Accordingly, the voltage difference across the second capacitor 220 corresponds to a magnitude of the bias current. Advantageously, the voltage difference across the second capacitor 220 may be used to determine the bias current of the first amplifier 105.

The voltage divider circuitry 125 is coupled to the buffer circuitry 110, the feedback circuitry 115, integration circuitry 120, the charge injection circuitry 130, and the controller circuitry 135. In the example of FIG. 2, the voltage divider circuitry 125 includes a second example resistor 225, a third example resistor 230, and a third example capacitor 235. In some examples, the voltage divider circuitry 125 may be referred to as a resistor-capacitor divider.

The second resistor 225 has a first terminal coupled to the common terminal that provides the common potential. The second resistor 225 has a second terminal coupled to the integration circuitry 120, the charge injection circuitry 130, the third resistor 230, and the third capacitor 235. The third resistor 230 has a first terminal coupled to the integration circuitry 120, the charge injection circuitry 130, the second resistor 225, and the third capacitor 235. The third resistor 230 has a second terminal coupled to the buffer circuitry 110, the feedback circuitry 115, the controller circuitry 135, and the third capacitor 235. The third capacitor 235 has a first terminal coupled to the integration circuitry 120, the charge injection circuitry 130, and the resistors 225 and 230. The third capacitor 235 has a second terminal coupled to the buffer circuitry 110, the feedback circuitry 115, the controller circuitry 135, and the third resistor 230. Alternatively, the voltage divider circuitry 125 may be modified, in accordance with the description herein, to be an alternative type of voltage divider circuitry.

The voltage divider circuitry 125, with the second capacitor 220, creates a feedback loop between the non-inverting input of the first amplifier 105 and the output of the second amplifier 205. Such a configuration allows the second capacitor 220 to self-integrate. Advantageously, using the circuitries 110-125 to create such a feedback loop reduces error resulting from an integration of the bias current to generate the voltage difference across the second capacitor 220. Advantageously, using the circuitries 110-125 to create such a feedback loop increases a precision of bias current measurements.

The voltage divider circuitry 125 amplifies the voltage difference across the second capacitor 220 by a gain (Gain). The gain of the voltage divider circuitry 125 may be modified by modifying resistances of the resistors 225 and 230. Modifying a capacitance of the third capacitor 235 stabilizes the closed loop configuration of the first amplifier 105. Amplifying the voltage difference across the second capacitor 220 causes relatively small changes in the voltage difference to be represented by relatively larger voltage changes. Advantageously, amplifying the voltage difference across the second capacitor 220 allows the controller circuitry 135 to measure relatively large voltage changes representative of changes in the voltage difference resulting from the bias current of the first amplifier 105.

The charge injection circuitry 130 is coupled to the integration circuitry 120, the voltage divider circuitry 125, and the controller circuitry 135. In the example of FIG. 2, the charge injection circuitry 130 includes an example switch 240 and an example charge source circuitry 245. The charge injection circuitry 130 supplies excess charges to the second terminal of the second capacitor 220. Advantageously, the excess charges compensate the second terminal of the second capacitor 220 for effects of the bias current of the amplifier 105 using charges from the charge injection circuitry 130.

The switch 240 has a first terminal coupled to the integration circuitry 120 and the voltage divider circuitry 125. The switch 240 has a second terminal coupled to the charge source circuitry 245. The switch 240 has a control terminal coupled to the controller circuitry 135. In some examples, the switch 240 may be implemented using one or more transistors controlled by the control circuitry 135. The controller circuitry 135 opens (is non-conducting) and closes (is conducting) the switch 240. The switch 240 causes the charge source circuitry 245 to supply current to the integration circuitry 120 and the voltage divider circuitry 125 when closed. In some examples, the switch 240 may be modified, replaced, and/or removed by enabling and disabling the charge source circuitry 245.

In example operation, the controller circuitry 135 closes the switch 240 to initialize and/or reset the second capacitor 220. Such a reset operation reduces the voltage difference across the second capacitor 220. In example operation the controller circuitry 135 opens the switch 240 to allow the bias current of the non-inverting input of the first amplifier 105 to modify the voltage difference across the second capacitor 220. Advantageously, the switch 240 allows the controller circuitry 135 to reset the voltage difference across the second capacitor 220. Advantageously, the switch 240 decreases a settling time of the second capacitor 220 between bias current measurements.

The charge source circuitry 245 is coupled to the switch 240. The charge source circuitry 245 supplies excess charges. The excess charges are supplied to the integration circuitry 120 and the voltage divider circuitry 125 when the switch 240 is closed. In some examples, the charge source circuitry 245 supplies an alternating current (AC) charge. For example, the charge source circuitry 245 may generate a sinusoidal AC signal or a square wave signal. The charge source circuitry 245 may be charge pump circuitry. Advantageously, the charge injection circuitry 130 reduces variations in a voltage of the output of the second amplifier 205 upon start-up of the measurement circuitry 200.

The controller circuitry 135 of FIG. 2 is a block diagram of an example implementation of the controller circuitry 135 of FIG. 1 to do determine a bias current of an input of the first amplifier 105. The controller circuitry 135 of FIG. 2 may be instantiated (e.g., creating an instance of, bring into being for any length of time, materialize, implement, etc.) by programmable circuitry such as a Central Processor Unit (CPU) executing first instructions. Additionally or alternatively, the controller circuitry 135 of FIG. 2 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the controller circuitry 135 of FIG. 2 may, thus, be instantiated at the same or different times. Some or all of the controller circuitry 135 of FIG. 2 may be instantiated, for example, in one or more threads executing concurrently on hardware and/or in series on hardware. Moreover, in some examples, some or all of the controller circuitry 135 of FIG. 2 may be implemented by microprocessor circuitry executing instructions and/or FPGA circuitry performing operations to implement one or more virtual machines and/or containers.

The controller circuitry 135 is coupled to the buffer circuitry 110, the feedback circuitry 115, the voltage divider circuitry 125, and the charge injection circuitry 130. In the example of FIG. 2, the controller circuitry 135 includes example sampling circuitry 250, example voltage monitor circuitry 255, example current determination circuitry 260, and example switch control circuitry 265. The controller circuitry 135 determines the bias current of an input of the first amplifier 105 by sampling the output of the second amplifier 205.

The sampling circuitry 250 has a first terminal coupled to the buffer circuitry 110, the feedback circuitry 115, and the voltage divider circuitry 125. The sampling circuitry 250 has a second terminal coupled to the voltage monitor circuitry 255. The sampling circuitry 250 samples a voltage of the output of the second amplifier 205. The output of the second amplifier 205 represents the voltage difference across the second capacitor 220 times the gain of the voltage divider circuitry 125. The sampling circuitry 250 supplies a voltage value representative of the voltage of the output of the second amplifier 205 to the voltage monitor circuitry 255. In some examples, the sampling circuitry 250 may be instantiated by processor circuitry executing sampling instructions and/or other circuitry performing operations such as those represented by the flowcharts of FIG. 11. In other examples, the sampling circuitry 250 may be instantiated by using a capacitor and one or more switches to sample the voltage of the output of the second amplifier 205. In such examples, the controller circuitry 135 controls the sampling circuitry 250 by opening and/or closing the one or more switches.

The voltage monitor circuitry 255 has a first terminal coupled to the sampling circuitry 250. The voltage monitor circuitry 255 has a second terminal coupled to the current determination circuitry 260. The voltage monitor circuitry 255 receives voltage values from the sampling circuitry 250. The voltage monitor circuitry 255 determines a change in the voltage values over time $$\left(\frac{dV}{dt}\right).$$

In some examples, the voltage monitor circuitry 255 uses voltage values separated by predetermined period of time. In such examples, the voltage monitor circuitry 255 divides a difference between the voltage values by the period of time to determine the change in the voltage values over time. The voltage monitor circuitry 255 supplies the change in the voltage values over time to the current determination circuitry 260. In some examples, the voltage monitor circuitry 255 is instantiated by processor circuitry executing voltage monitor instructions and/or other circuitry performing operations such as those represented by the flowcharts of FIG. 11.

The current determination circuitry 260 has a first terminal coupled to the voltage monitor circuitry 255. The current determination circuitry 260 has a second terminal coupled to the switch control circuitry 265. The current determination circuitry 260 receives the change in the voltage values over time from the voltage monitor circuitry 255. The current determination circuitry 260 determines the bias current ($I_{BIAS}$) at the non-inverting input of the first amplifier 105 based on the change in the voltage values over time $$\left(\frac{dV}{dt}\right),$$

the capacitance (CAP) of the second capacitor 220, and the gain (Gain) of the voltage divider circuitry 125. The bias current is approximately equal to a multiplication of the change in the voltage values over time and a division of the capacitance of the second capacitor 220 by the gain of the voltage divider circuitry 125. The current determination circuitry 260 may use Equation (1), below, to determine the bias current.

$$I_{BIAS} = \frac{dV}{dt} * \frac{CAP}{\text{Gain}} \qquad \text{Equation (1)}$$

In some examples, the current determination circuitry 260 generates a reset indication after determining the bias current using Equation (1), above. The reset indication indicates to the switch control circuitry 265 to initiate resetting the voltage difference across the second capacitor 220. In some examples, the current determination circuitry 260 generates the reset indication after one or more bias current calculations. In other examples, the current determination circuitry 260 generates the reset indication periodically. The current determination circuitry 260 supplies the reset indication to the switch control circuitry 265. In some examples, the current determination circuitry 260 is instantiated by processor circuitry executing current determination instructions and/or other circuitry performing operations such as those represented by the flowcharts of FIG. 11.

The switch control circuitry 265 has a first terminal coupled to the current determination circuitry 260. The switch control circuitry 265 has a second terminal coupled to the switch 240. The switch control circuitry 265 receives the reset indication from the current determination circuitry 260. The switch control circuitry 265 closes the switch 240 in response to the reset indication. In some examples, the switch control circuitry 265 closes the switch 240 for a predetermined duration. In this manner, the switch control circuitry 265 controls the charge injection circuitry 130 to supply excess charges to the integration circuitry 120 and the voltage divider circuitry 125 by closing the switch 240. The switch control circuitry 265 opens the switch 240 after allowing the excess charges to reduce the voltage difference across the second capacitor 220. Such a reduction may be referred to as allowing the voltage difference across the second capacitor 220 to settle.

In example operation, the controller circuitry 135 closes the switch 240 to reset the second capacitor 220. Such a reset operation reduces the voltage difference across the second capacitor 220. In example operation, the controller circuitry 135 opens the switch 240 to allow the bias current of the non-inverting input of the amplifier 105 to modify the voltage difference across the second capacitor 220. Advantageously, the switch 240 allows the controller circuitry 135 to reset the voltage difference across the second capacitor 220. Advantageously, excess charges supplied while the switch 240 is closed decreases a settling time of the second capacitor 220 between bias current measurements. In an example operation, the switch control circuitry 265 keeps the switch 240 open while the controller circuitry 135 determines the bias current. Advantageously, resetting the voltage difference across the second capacitor 220 reduces errors in the bias current calculation from increasing over time. In some examples, the switch control circuitry 265 is instantiated by processor circuitry executing switch control instructions and/or other circuitry performing operations such as those represented by the flowcharts of FIG. 10.

An example timing diagram of an initialization and reset of the measurement circuitry 200 is illustrated and discussed in further detail in FIG. 9, below. Also, example operations of the controller circuitry 135 controlling the switch 240 is described in further detail in FIG. 10, below.

Figure 3:
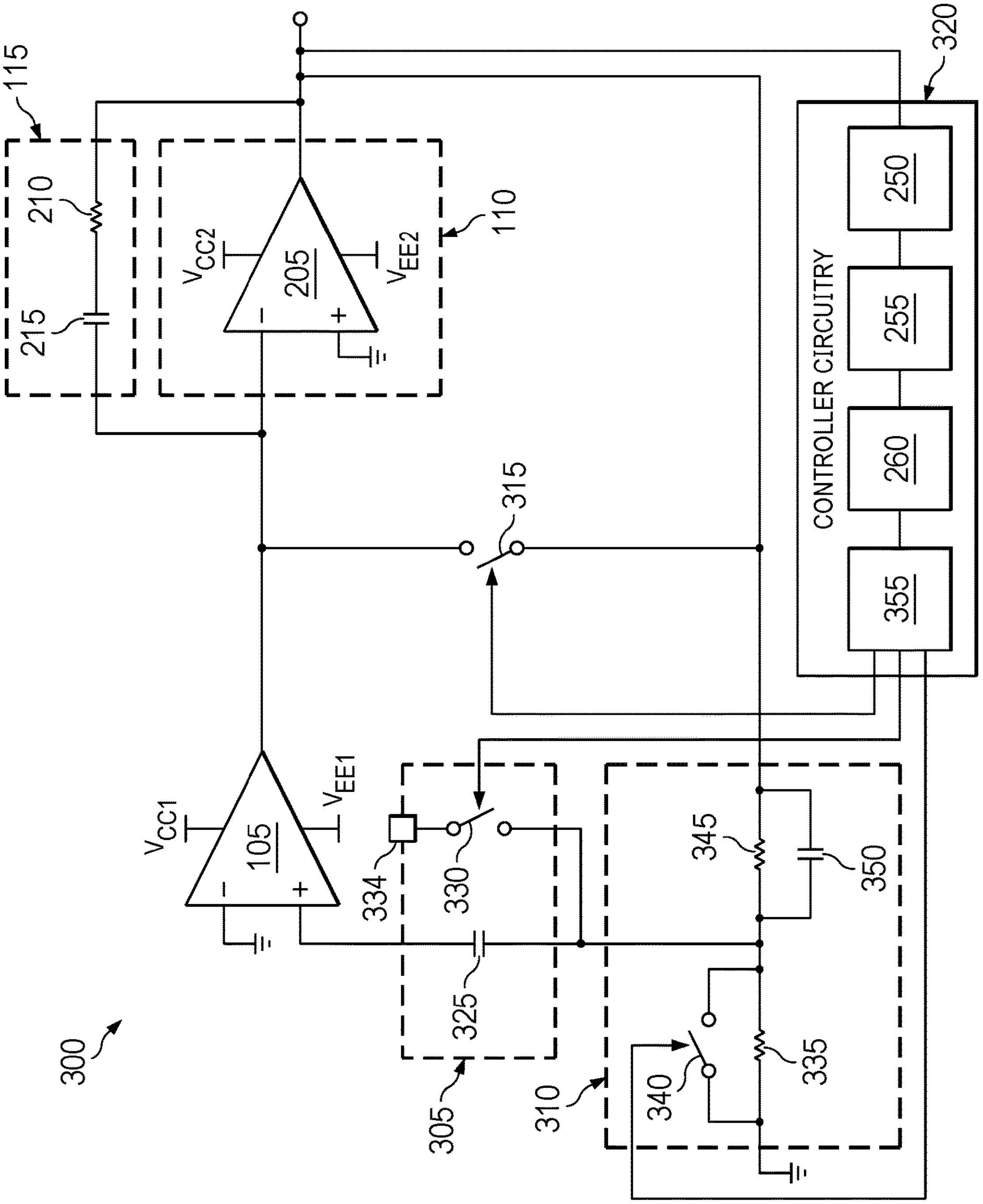
FIG. 3 is a schematic diagram of an example of the measurement circuitry of FIG. 1 to measure an input bias current of the non-inverting input of the amplifier of FIGS. 1 and 2, the measurement circuitry including reset switches.

FIG. 3 is a schematic diagram of an example measurement circuitry 300. The measurement circuitry 300 of FIG. 3 is an example of the measurement circuitry 100 of FIG. 1. In the example of FIG. 3, the measurement circuitry 300 includes the amplifier 105 of FIGS. 1 and 2, the buffer circuitry 110 of FIGS. 1 and 2, the feedback circuitry 115 of FIGS. 1 and 2, example integration circuitry 305, example voltage divider circuitry 310, a first example switch 315, and example controller circuitry 320. In the example of FIG. 3, the amplifier 105 may be referred to as a first amplifier 105. The measurement circuitry 300 determines a bias current of a non-inverting input of the first amplifier 105 based on an output voltage of the buffer circuitry 110, a capacitance of the integration circuitry 305, and a gain of the voltage divider circuitry 310.

The integration circuitry 305 is coupled to the first amplifier 105, the voltage divider circuitry 310, and the controller circuitry 320. In the example of FIG. 3, the integration circuitry 305 includes a first example capacitor 325, a second example switch 330, and a reference voltage terminal 334. The first capacitor 325 has a first terminal coupled to the non-inverting input of the first amplifier 105. The first capacitor 325 has a second terminal coupled to the voltage divider circuitry 310 and the second switch 330. The first capacitor 325 has a capacitance (CAP). A bias current of the first amplifier 105 modifies a voltage difference across the first capacitor 325. Accordingly, the voltage difference across the first capacitor 325 corresponds to a magnitude of the bias current of the non-inverting input of the first amplifier 105. Advantageously, the voltage difference across the first capacitor 325 may be used to determine the bias current of the first amplifier 105.

The second switch 330 has a first terminal coupled to the reference voltage terminal 334. The second switch 330 has a second terminal coupled to the voltage divider circuitry 310 and the first capacitor 325. The second switch 330 has a control terminal coupled to the controller circuitry 320. In some examples, the second switch 330 is implemented by one or more transistors controlled by the controller circuitry 320. The controller circuitry 320 opens (is non-conducting) and closes (is conducting) the second switch 330. The second switch 330 couples the second terminal of the first capacitor 325 to the reference voltage terminal 334 when closed. In some examples, the second switch 330 may be modified, replaced, and/or removed by enabling and disabling a voltage source that supplies the reference voltage to the reference voltage terminal 334.

The voltage divider circuitry 310 is coupled to the buffer circuitry 110, the feedback circuitry 115, the integration circuitry 305, the first switch 315, and the controller circuitry 320. In the example of FIG. 3, the voltage divider circuitry 310 includes a first example resistor 335, a third example switch 340, a second example resistor 345, and a second example capacitor 350. In some examples, the voltage divider circuitry 310 may be referred to as a resistor-capacitor divider.

The first resistor 335 has a first terminal coupled to the common terminal that provides the common potential. The first resistor 335 has a second terminal coupled to the integration circuitry 305, the third switch 340, the second resistor 345, and the second capacitor 350. The third switch 335 has a first terminal coupled to the common terminal and the first resistor 335. The third switch 335 has a second terminal coupled to the integration circuitry 305, the resistors 335 and 345, and the second capacitor 350. The third switch 340 has a control terminal coupled to the controller circuitry 320. In some examples, the third switch 340 is implemented using one or more transistors controlled by the controller circuitry 320. The controller circuitry 320 opens (is non-conducting) and closes (is conducting) the third switch 340. The third switch 340 couples the second terminal of the first resistor 335 to the common terminal when closed.

The second resistor 345 has a first terminal coupled to the integration circuitry 305, the first resistor 335, the third switch 340, and the second capacitor 350. The second resistor 345 has a second terminal coupled to the buffer circuitry 110, the feedback circuitry 115, the first switch 315, the controller circuitry 320, and the second capacitor 350. The second capacitor 350 has a first terminal coupled to the integration circuitry 305, the resistors 335 and 345, and the third switch 340. The second capacitor 350 has a second terminal coupled to the buffer circuitry 110, the feedback circuitry 115, the first switch 315, and the second resistor 345. Alternatively, the voltage divider circuitry 310 may be modified, in accordance with the description herein, to be an alternative type of voltage divider circuitry.

The voltage divider circuitry 310, with the integration circuit 305, creates a feedback loop between the non-inverting input and the output of the first amplifier 105. Such a configuration allows the first capacitor 325 to self-integrate. Advantageously, using the circuitries 110, 115, 305, and 310 to create such a feedback loop reduces error resulting from an integration of the bias current to generate the voltage difference across the first capacitor 325. Advantageously, using the circuitries 110, 115, 305, and 310 to create such a feedback loop increases a precision of bias current measurements.

The voltage divider circuitry 310 amplifies the voltage difference across the first capacitor 325 by a gain (Gain). The gain of the voltage divider circuitry 310 may be modified by modifying resistances of the resistors 335 and 345. Modifying a capacitance of the second capacitor 350 stabilizes the closed loop configuration of the first amplifier 105. Amplifying the voltage difference across the first capacitor 325 causes relatively small changes in the voltage difference to be represented by relatively larger voltage changes. Advantageously, amplifying the voltage difference across the first capacitor 325 allows the controller circuitry 320 to measure relatively large voltage changes representative of changes in the voltage difference resulting from the bias current of the first amplifier 105.

The first switch 315 has a first terminal coupled to the first amplifier 105, the buffer circuitry 110, and the feedback circuitry 115. The first switch 315 has a second terminal coupled to the buffer circuitry 110, the feedback circuitry 115, and the voltage divider circuitry 310. The first switch 315 has a control terminal coupled to the controller circuitry 320. In some examples, the first switch 315 is implemented using one or more transistors controlled by the controller circuitry 320. The controller circuitry 320 opens (is non-conducting) and closes (is conducting) the first switch 315. The first switch 315 couples the output of the first amplifier 105 to the output of the buffer circuitry 110 when closed.

The controller circuitry 320 is a block diagram of an example implementation of the controller circuitry 320 to do determine a bias current of an input of the first amplifier 105. The controller circuitry 320 of FIG. 3 may be instantiated (e.g., creating an instance of, bring into being for any length of time, materialize, implement, etc.) by programmable circuitry such as a Central Processor Unit (CPU) executing first instructions. Additionally or alternatively, the controller circuitry 320 of FIG. 3 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the controller circuitry 320 of FIG. 3 may, thus, be instantiated at the same or different times. Some or all of the controller circuitry 320 of FIG. 3 may be instantiated, for example, in one or more threads executing concurrently on hardware and/or in series on hardware. Moreover, in some examples, some or all of the controller circuitry 320 of FIG. 3 may be implemented by microprocessor circuitry executing instructions and/or FPGA circuitry performing operations to implement one or more virtual machines and/or containers.

The controller circuitry 320 is coupled to the buffer circuitry 110, the feedback circuitry 115, the integration circuitry 305, the voltage divider circuitry 310, and the first switch 315. In the example of FIG. 3, the controller circuitry 320 includes the sampling circuitry 250 of FIG. 2, example voltage monitor circuitry 255 of FIG. 2, example current determination circuitry 260 of FIG. 2, and example switch control circuitry 355. The controller circuitry 320 determines the bias current of an input of the first amplifier 105 by sampling the output of the second amplifier 205.

The switch control circuitry 355 has a first terminal coupled to the current determination circuitry 260. The switch control circuitry 355 has a second terminal coupled to the first switch 315. The switch control circuitry 355 has a third terminal coupled to the second switch 330. The switch control circuitry 355 has a fourth terminal coupled to the third switch 340. The switch control circuitry 355 receives the reset indication from the current determination circuitry 260. The switch control circuitry 355 controls the switches 315, 330, and 340 in response to the reset indication. In an example operation, the switch control circuitry 355 first closes the first switch 315 to set the output of the first amplifier 105 approximately equal to the output of the second amplifier 205. In such an example operation, the switch control circuitry closes the third switch 340 to set the second terminal of the first capacitor 325 equal to the common potential of the common terminal. In such example operations, the switch control circuitry 355 further closes the second switch 330 to set the voltage of the second terminal of the first capacitor 325 approximately equal to the reference voltage of the reference voltage terminal 334. Finally, the switch control circuitry 355 opens the second switch 330. During the example operation, the controller circuitry 320 determines the bias current after the switch control circuitry 355 opens the second switch 330.

In some examples, the switch control circuitry 355 closes the switches 315, 330, and/or 340 for a predetermined duration. The switch control circuitry 355 opens the switches 315, 330, and/or 340 after allowing voltages to settle. In an example operation, the switch control circuitry 355 keeps the switches 315, 330, and 340 open while the controller circuitry 320 determines the bias current. Advantageously, initializing voltages of terminals of the measurement circuitry 300 reduces errors in the bias current calculation. Advantageously, initializing voltage of terminals of the measurement circuitry 300 reduces non-linear voltage measurements immediately after supplying power to the measurement circuitry 300. In some examples, the switch control circuitry 355 is instantiated by processor circuitry executing switch control instructions and/or other circuitry performing operations such as those represented by the flowcharts of FIG. 9.

Figure 4:
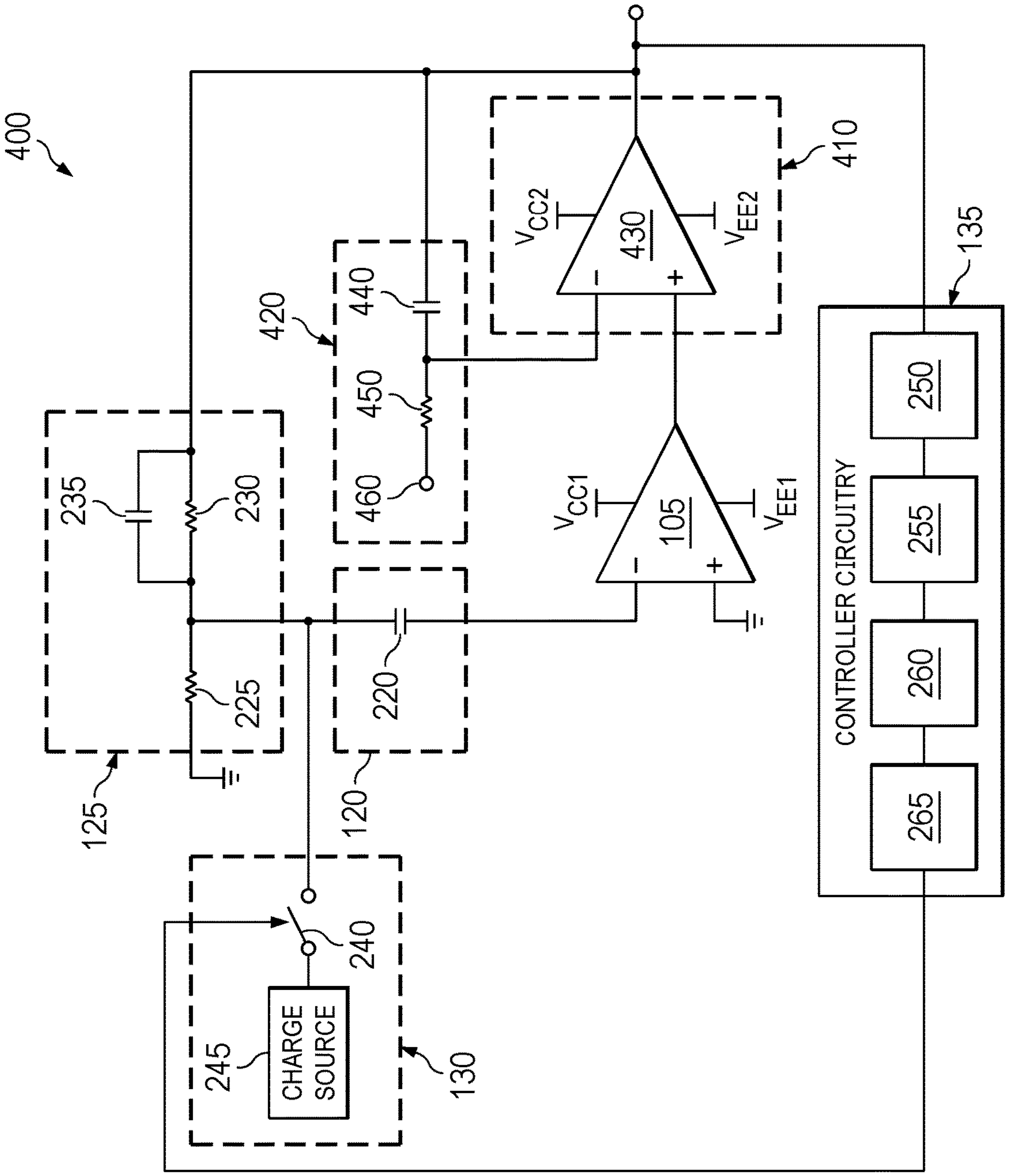
FIG. 4 is a schematic diagram of an example of the measurement circuitry of FIG. 1 to measure an input bias current of an inverting input of the amplifier of FIGS. 1-3, the measurement circuitry including charge injection circuitry.

FIG. 4 is a schematic diagram of an example measurement circuitry 400. In the example of FIG. 4, the measurement circuitry 400 includes the amplifier 105 of FIG. 1, the integration circuitry 120 of FIGS. 1 and 2, the voltage divider circuitry 125 of FIGS. 1 and 2, the charge injection circuitry 130 of FIGS. 1 and 2, the controller circuitry 135 of FIGS. 1 and 2, example buffer circuitry 410, and example feedback circuitry 420. In the example of FIG. 4, the amplifier 105 may be referred to as a first amplifier 105. The measurement circuitry 400 determines a bias current of an inverting input of the first amplifier 105 based on a capacitance of the integration circuitry 120, a gain of the voltage divider circuitry 125, and an output voltage of the buffer circuitry 410. Similar to FIG. 2, the measurement circuitry 400 uses the charge injection circuitry 130 to initialize and/or reset the integration circuitry 120. The controller circuitry 135 causes the charge injection circuitry 130 to supply excess charges to the integration circuitry 120 and the voltage divider circuitry 125. Advantageously, the charge injection circuitry 130 may be used to determine a bias current of the inverting input of the first amplifier 105.

The buffer circuitry 410 is coupled to the first amplifier 105, the voltage divider circuitry 125, the controller circuitry 135, and the feedback circuitry 420. In the example of FIG. 4, the buffer circuitry 410 includes a second example amplifier 430. The second amplifier 430 has a first supply terminal coupled to a first reference voltage ($V_{CC2}$). The second amplifier 430 has a second supply terminal coupled to a second reference voltage ($V_{EE2}$). The second amplifier 430 has a non-inverting input coupled to the first amplifier 105. The second amplifier 430 has an inverting input coupled to the feedback circuitry 420. The second amplifier 430 has an output coupled to the voltage divider circuitry 125, the controller circuitry 135, and the feedback circuitry 420. The second amplifier 430 buffers voltages supplied to the non-inverting input of the second amplifier 430.

The feedback circuitry 420 is coupled to the voltage divider circuitry 125, the controller circuitry 135, and the buffer circuitry 410. In the example of FIG. 4, the feedback circuitry 420 includes an example capacitor 440, an example resistor 450, and an example voltage reference terminal 460. The capacitor 440 has a first terminal coupled to voltage divider circuitry 125, the controller circuitry 135, and the buffer circuitry 410. The capacitor 440 has a second terminal coupled to the buffer circuitry 410 and the resistor 450. The resistor 450 has a first terminal coupled to the buffer circuitry 410 and the capacitor 440. The resistor 450 has a second terminal coupled to the voltage reference terminal 460. The voltage reference terminal 460 provides a reference control voltage to the resistor 450. The reference control voltage of the voltage reference terminal 460 biases the output of the second amplifier 430. Advantageously, the feedback circuitry 420 creates a closed loop between the inverting input and output of the second amplifier 430.

In some examples, the reference control voltage of the voltage reference terminal 460 is set to increase a likelihood that the common mode voltage of the output of the first amplifier 105 is between the first and second reference voltages of the supply terminals of the second amplifier 430. Advantageously, the controller circuitry 135 may use the switch 240 of FIG. 2 to initialize and/or reset the voltage difference across the second capacitor 220 of FIG. 2 when determining the bias current of the inverting input of the first amplifier 105.

Figure 5:
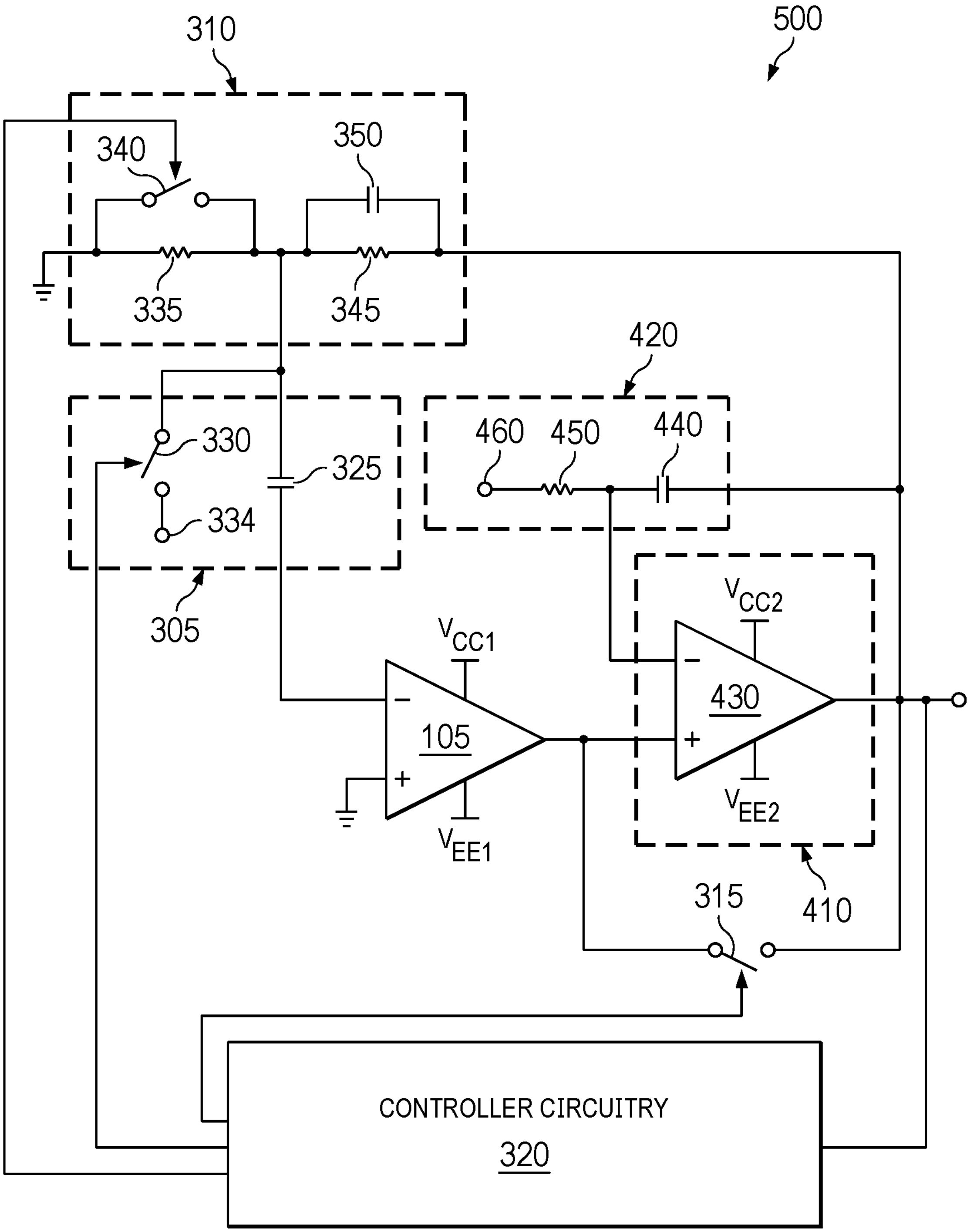
FIG. 5 is a schematic diagram of an example of the measurement circuitry of FIG. 1 to measure an input bias current of the inverting input of the amplifier of FIGS. 1 and 3, the measurement circuitry including reset switches.

FIG. 5 is a schematic diagram of an example measurement circuitry 500. In the example of FIG. 5, the measurement circuitry 500 includes the amplifier 105 of FIGS. 1-4, the integration circuitry 305 of FIG. 3, the voltage divider circuitry 310 of FIG. 3, the first switch 315 of FIG. 3, the controller circuitry 320 of FIG. 3, the buffer circuitry 410 of FIG. 4, and the feedback circuitry 420 of FIG. 4. The measurement circuitry 500 determines a bias current of a inverting input of the amplifier 105 based on a capacitance of the integration circuitry 305, a gain of the voltage divider circuitry 310, and an output voltage of the buffer circuitry 410. Advantageously, the switches 315, 330, and 340 may initialize and/or reset the measurement circuitry 500 to determine the bias current of the inverting input of the amplifier 105.

Figure 6:
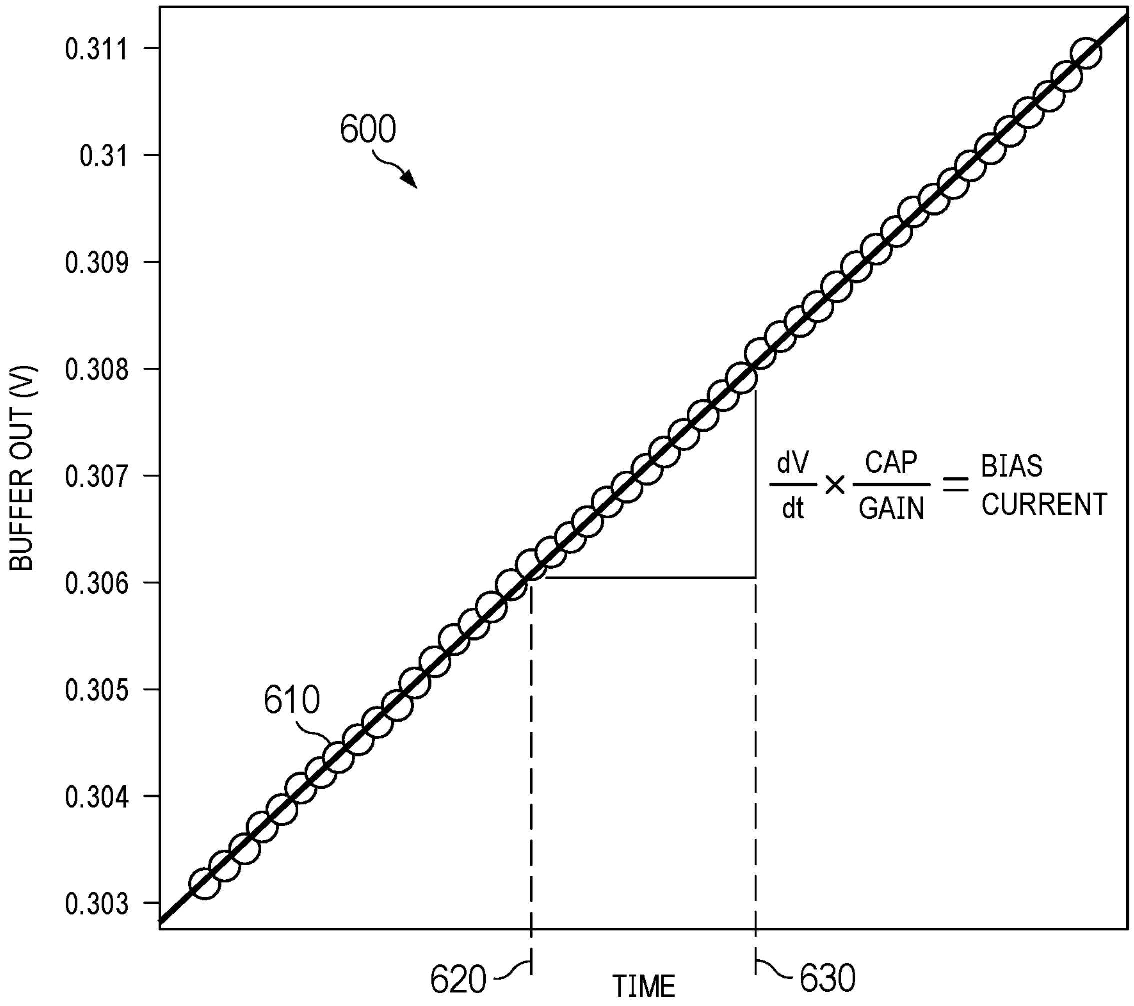
FIG. 6 is a timing diagram of an example operation of the measurement circuitry of FIG. 1.

FIG. 6 is a timing diagram 600 of an example operation of the measurement circuitries 100 of FIG. 1, 200 of FIG. 2, 300 of FIG. 3, 400 of FIG. 4, and/or 500 of FIG. 5. In the example of FIG. 6, the timing diagram 600 includes example buffer output voltage measurements 610. The buffer output voltage measurements 610 represent voltage measurements at the output of the amplifiers 205 of FIGS. 2 and 3 or 430 of FIGS. 4 and 5. Using Equation (1), above, the controller circuitries 135 of FIGS. 1, 2, and 4 and/or 320 of FIGS. 3 and 5 determine the bias current at inputs of the amplifier 105 of FIGS. 1-5.

In an example operation, the sample circuitry 250 of FIGS. 2 and 3 measure the buffer output voltage measurements 610. In example operation, voltages of the buffer output voltage measurements 610 may vary based on characteristics of each component, such as the voltage divider circuitry 135 and/or 310, the amplifiers 205 and/or 430, etc. Also, voltages of the buffer output voltage measurements 610 may vary based on operating conditions of the measurement circuitries 100, 200, 300, 400, and/or 500, such as temperature, supply voltages, etc. The sample circuitry 250 supplies the buffer output voltage measurements 610 to the voltage monitor circuitry 255 of FIGS. 2 and 3 to determine the change in voltage over time (dV/dt). For example, the voltage monitor circuitry 255 determines the change in voltage over time between a first time 620 and a second time 630. Advantageously, the buffer output voltage measurements 610 increase linearly over time. In some examples, the voltage monitor circuitry 255 may represent the change in voltage over time as a slope of the buffer output voltage measurements 610. The current determination circuitry 260 of FIGS. 2 and 3 determines the bias current at an input of the amplifier 105 based on the change in voltage over time, the capacitance of the integration circuitries 120 of FIGS. 1, 2, and 4 and/or 305 of FIGS. 3 and 5, and the gain of the voltage divider circuitries 125 of FIGS. 1, 2, and 4 and/or 310 of FIGS. 3 and 5.

Figure 7:
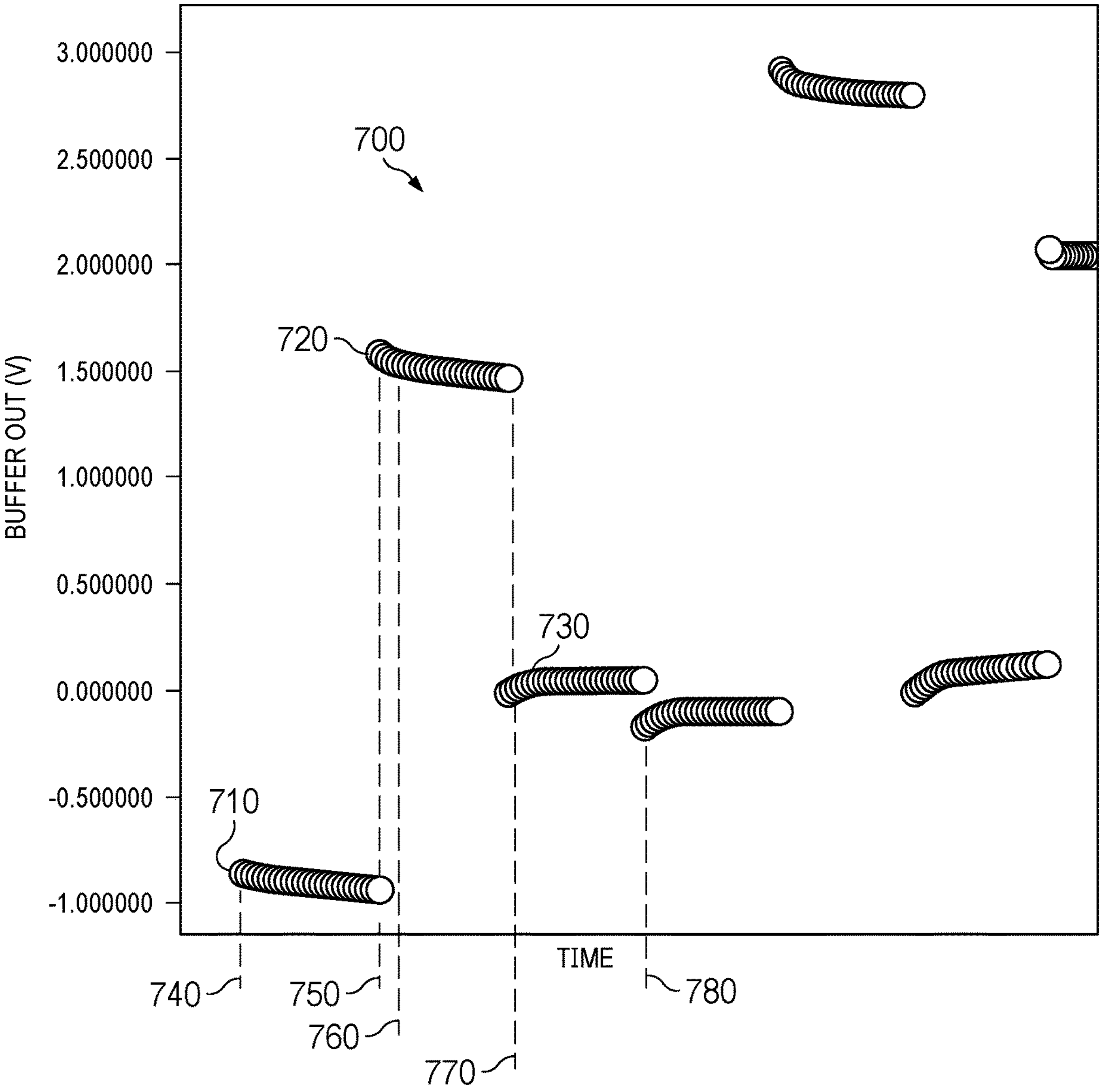
FIG. 7 is a timing diagram of an example operation of the measurement circuitry of FIG. 3 including the reset switches of FIGS. 3 and 5.

FIG. 7 is a timing diagram 700 of an example operation of the measurement circuitry 300 of FIG. 3 and 500 of FIG. 5 using switches 315, 330, and 340 of FIGS. 3 and 5. In the example of FIG. 7, the timing diagram 700 includes first example buffer output voltage measurements 710, second example buffer output voltage measurements 720, and third example buffer output voltage measurements 730.

The first buffer output voltage measurements 710 represent voltage measurements at the output of the amplifier 205 of FIG. 3 or 430 of FIG. 5 between a first time 740 and a second time 750. At the second time 750, the controller circuitry 320 uses the switches 315, 330, and 340 to reset the measurement circuitry 300 or 500. Example reset operations of the controller circuitry 320 using the switches 315, 330, and 340 are described in further detail in FIG. 9, below.

The second buffer output voltage measurements 720 represent voltage measurements at the output of the amplifier 205 or 430 following the reset operations at the second time 750. Resetting the measurement circuitry 300 and/or 500 using the switches 315, 330, and 340 results in the second buffer output voltage measurements 720 having a different direct current (DC) offset from the first buffer output voltage measurements 710. Differences in the DC offset at the second time 750 between the buffer output voltage measurements 710 and 720 results from spontaneous charge coupling of a high impedance of a terminal of the capacitor 325 of FIGS. 3 and 5, due to startup. Dielectric relaxation occurs immediately after the initialization or reset operations. Also, the bias current of the amplifier 105 charge and/or discharge the capacitor 325 of FIGS. 3 and 5.

The dielectric relaxation of the first capacitor 325 causes the buffer output voltage measurements 710-730 to be non-linear immediately following reset operations. The controller circuitry 320 may wait to determine the bias current until the second buffer output measurements 720 begin to change linearly, such as a third time 760. The duration of non-linear operation increases as the difference in the DC offset between measurements increases. Also, the duration of non-linear operation decreases as the difference in the DC offset between measurements decreases. Such changes in the duration of non-linear operation results from a depth at which charges are in the dielectric region of the first capacitor 325. At the third time 760, the voltage difference across the first capacitor 325 has settled and the output of the second amplifier 205 and/or 430 begins to change linearly in response to the bias current. Between the third time 760 and a fourth time 770, the second buffer output voltage measurements 720 may be used by the measurement circuitry 300 and/or 500 to determine the bias current of the amplifier 105. At the fourth time 770, the controller circuitry 320 uses the switches 315, 330, and 340 to reset the measurement circuitry 300 and/or 500.

The third buffer output voltage measurements 730 represent voltage measurements at the output of the amplifier 205 and/or 430 following the reset operations at the fourth time 770. Resetting the measurement circuitry 300 and/or 500 using the switches 315, 330, and 340 results in the third buffer output voltage measurements 730 having a different DC offset from the second buffer output voltage measurements 720. At a fifth time 780, the controller circuitry 320 uses the switches 315, 330, and 340 to reset the measurement circuitry 300 and/or 500.

Figure 8:
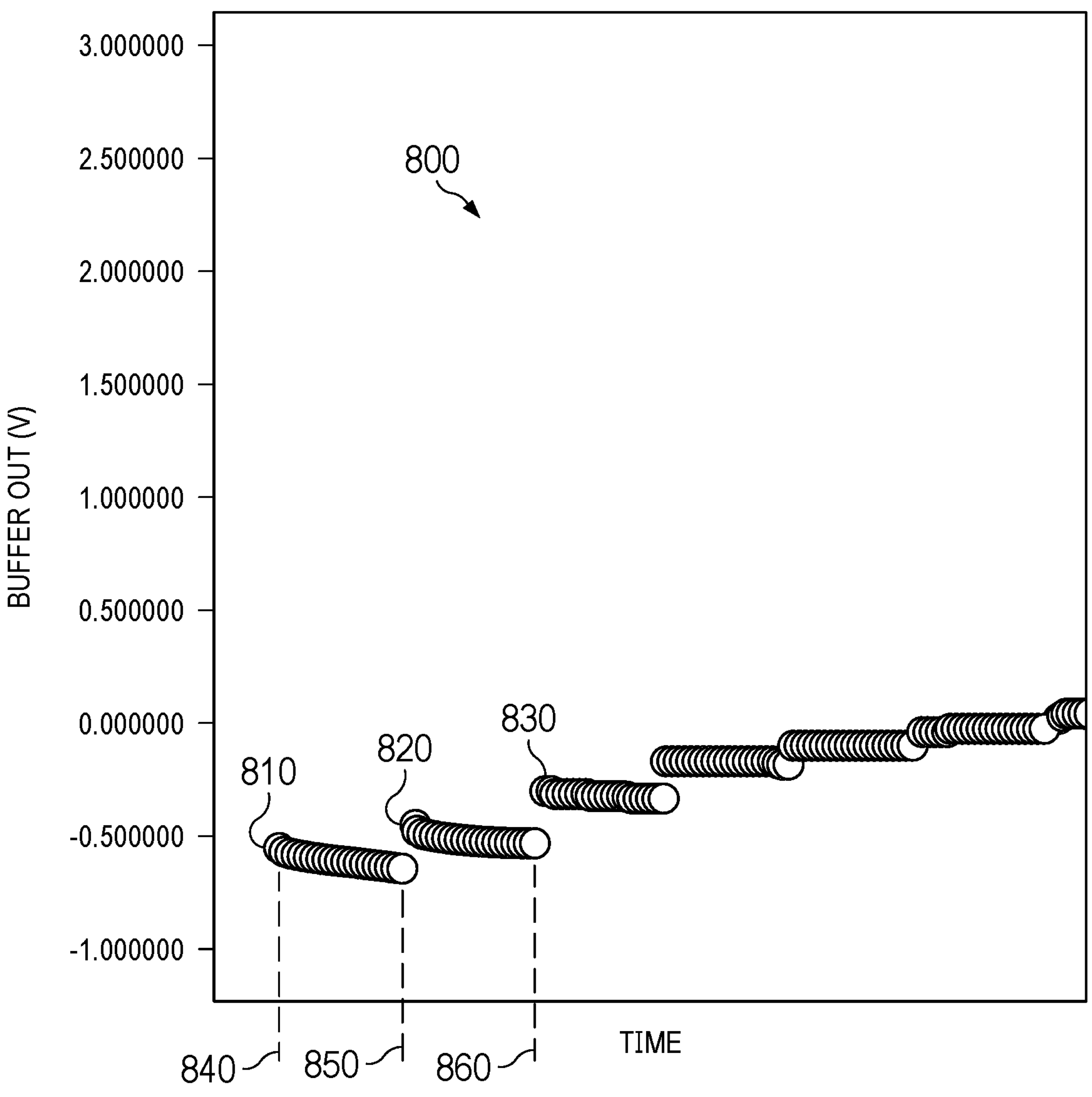
FIG. 8 is a timing diagram of an example operation of the measurement circuitry of FIGS. 2 and 4 including the charge injection circuitry of FIGS. 2 and 4.

FIG. 8 is a timing diagram 800 of an example operation of the measurement circuitry 100 of FIG. 1, 200 of FIG. 2, and 400 of FIG. 4 using the charge injection circuitry 130 of FIGS. 1, 2, and 4. In the example of FIG. 8, the timing diagram 800 includes first example buffer output voltage measurements 810, second example buffer output voltage measurements 820, and third example buffer output voltage measurements 830. In comparison to FIG. 7, the first buffer output voltage measurements 710 of FIG. 7 corresponds to the first buffer output voltage measurements 810, the second buffer output voltage measurements 720 of FIG. 7 and the second buffer output voltage measurements 820, the third buffer output voltage measurements 730 of FIG. 7, and the buffer output voltage measurements 830, respectively. Each corresponding set of measurements corresponds to different operating conditions of the amplifier 105, such as modifying common mode voltages by modifying $V_{CC1}$ and $V_{EE1}$.

The first buffer output voltage measurements 810 represent voltage measurements at the output of the amplifiers 205 of FIGS. 2 and 430 of FIG. 4 between a first time 840 and a second time 850. At the second time 850, the controller circuitry 135 of FIGS. 1, 2, and 4 uses the switch 240 of FIGS. 2 and 4 to couple the charge source circuitry 245 of FIGS. 2 and 4 to the voltage divider circuitry 125 of FIGS. 1, 2, and 4 and the integration circuitry 120 of FIGS. 1, 2, and 4. The charge injection circuitry 130 supplies excess charges to the second terminal of the second capacitor 220 of FIGS. 2 and 4 to reset the voltage difference across the second capacitor 220. Example reset operations of the controller circuitry 135 using the charge injection circuitry 130 are described in further detail in FIG. 10, below.

The second buffer output voltage measurements 820 represent voltage measurements at the output of the amplifier 205 and/or 430 following the reset operations at the second time 850. The excess charges from the charge injection circuitry 130 reduces differences in the DC offset between the buffer output voltage measurements 810 and 820 by compensating for dielectric absorption relaxation of the second capacitor 220 of FIGS. 2 and 4. Also the excess charges from the charge injection circuitry 130 reduces a duration of non-linear operation immediately following a reset of the measurement circuitry 100, 200, and/or 400.

Advantageously, using the charge injection circuitry 130 to reset the measurement circuitries 100, 200, and 300 decreases a settling time of the second buffer output voltage measurements 820. Accordingly, the controller circuitry 135 may begin to accurately determine the bias current of an input of the amplifier 105 at a time immediately following opening the switch 240. At a third time 860, the controller circuitry 135 uses the switch 240 to couple the charge source circuitry 245 to the voltage divider circuitry 125 and the integration circuitry 120. The third buffer output voltage measurements 830 represent voltage measurements at the output of the amplifier 205 and/or 430 following the reset operations at the third time 860.

Figure 9:
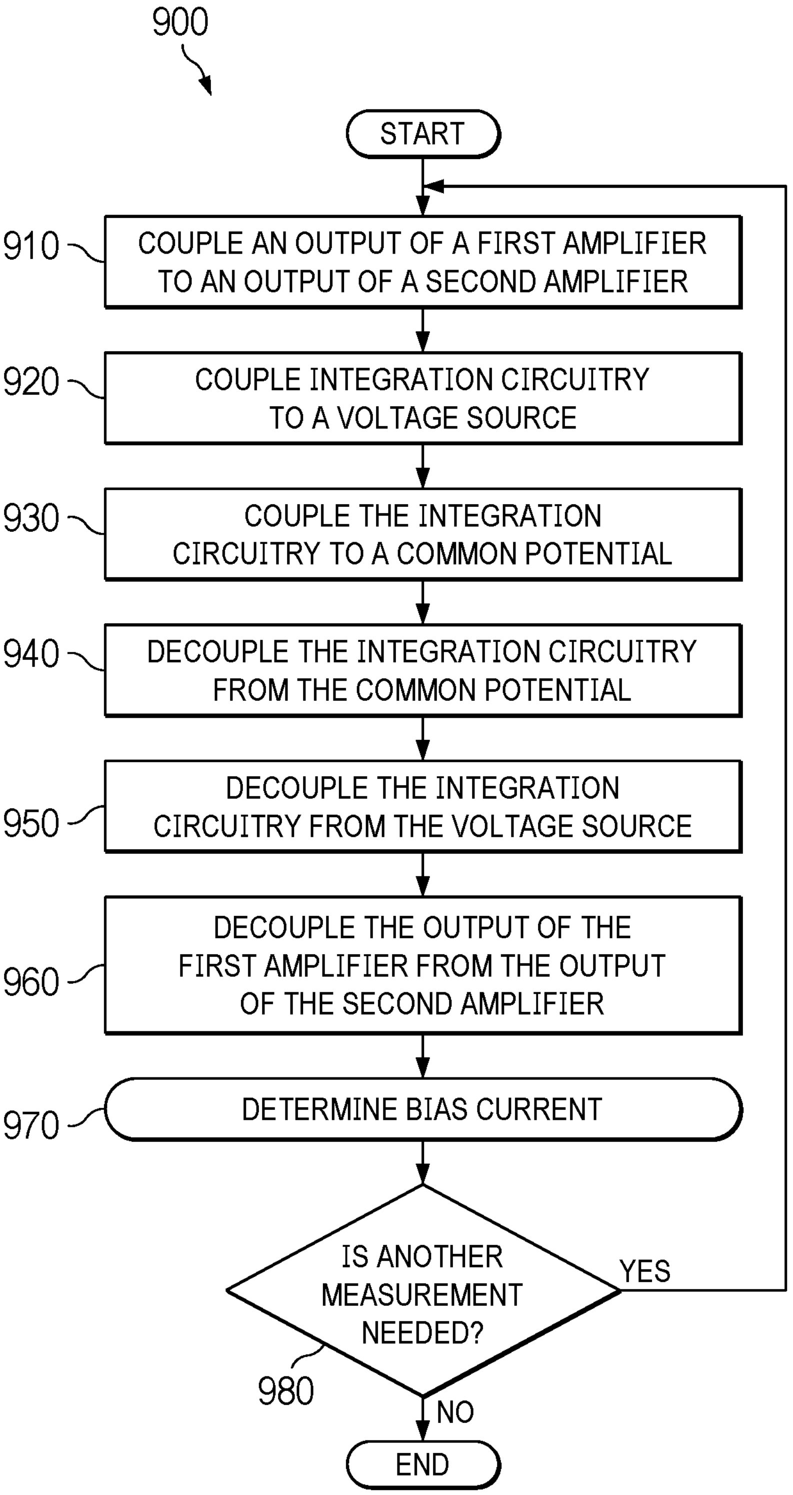
FIG. 9 is a flowchart representative of example machine-readable instructions and/or example operations that may be executed, instantiated, and/or performed using an example programmable circuitry and/or other hardware implementation to determine a bias current of an input of the amplifier of FIG. 1 using the measurement circuitry of FIGS. 3 and 5.

FIG. 9 is a flowchart representative of example machine-readable instructions and/or example operations 900 that may be executed, instantiated, and/or performed by programmable circuitry and/or other hardware to determine a bias current of an input of the amplifier 105 of FIGS. 3 and 5 using the measurement circuitry 300 of FIGS. 3 and 5. The example machine-readable instructions and/or the example operations 900 of FIG. 9 begin at block 910, at which the first switch 315 of FIGS. 3 and 5 couples the output of the first amplifier 105 to the output of the second amplifier 205 of FIGS. 3 and/or 430 of FIG. 5. In some examples, the switch control circuitry 355 of FIG. 3 closes the first switch 315 to couple the output of the first amplifier 105 to the output of the second amplifier 205.

The second switch 330 of FIGS. 3 and 5 couples the integration circuitry 305 to the reference voltage terminal 334 of FIGS. 3 and 5. (Block 920). In some examples, the switch control circuitry 355 closes the second switch 330 to couple the integration circuitry 305 to the reference voltage terminal 334.

The third switch 340 of FIGS. 3 and 5 couples the integration circuitry 305 of FIGS. 3 and 5 to the common potential. (Block 930). In some examples, the switch control circuitry 355 closes the third switch 340 to couple the integration circuitry 305 to the common terminal, which provides the common potential.

The third switch 340 decouples the integration circuitry 305 from the common potential. (Block 940). In some examples, the switch control circuitry 355 opens the third switch 340 to decouple the integration circuitry 305 from the common terminal, which provides the common potential.

The second switch 330 decouples the integration circuitry 305 from the reference voltage terminal 334. (Block 950). In some examples, the switch control circuitry 355 opens the second switch 330 to couple the integration circuitry 305 from the reference voltage terminal 334.

The first switch 315 decouples the output of the first amplifier 105 from the output of the second amplifier 205 and/or 430. (Block 960). In some examples, the switch control circuitry 355 opens the first switch 315 to decouple the output of the first amplifier 105 from the output of the second amplifier 205 and/or 430.

The controller circuitry 320 of FIGS. 3 and 5 determines a bias current. (Block 970). Example operations to determine the bias current are described in FIG. 11, below.

The controller circuitry 320 determines if another measurement is needed. (Block 980). If the controller circuitry 320 determines that another measurement is needed (e.g., Block 980 returns a result of YES), control returns to Block 910. If the controller circuitry 320 determines that another measurement is not needed (e.g., Block 980 returns a result of NO), control proceeds to end.

Although example processes are described with reference to the flowchart illustrated in FIG. 9, many other methods of determining a bias current of an input of the amplifier 105 using the measurement circuitry 300 may alternatively be used in accordance with teachings of this disclosure. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 10:
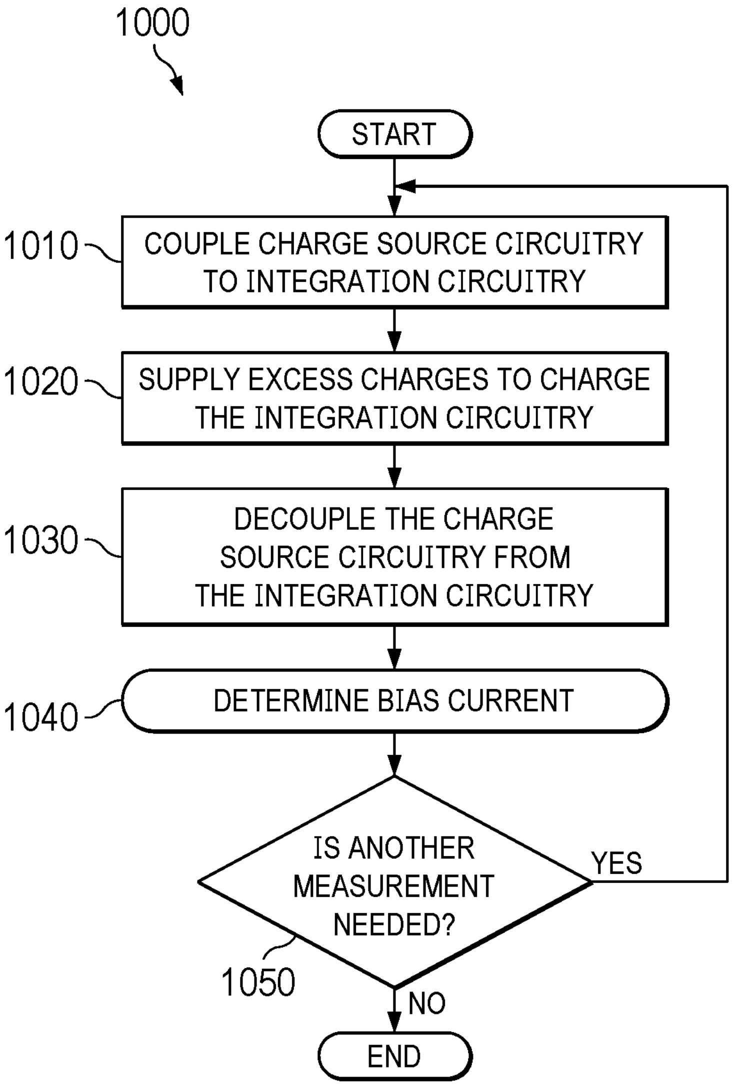
FIG. 10 is a flowchart representative of example machine-readable instructions and/or example operations that may be executed, instantiated, and/or performed using an example programmable circuitry and/or other hardware implementation to determine a bias current of an input of the amplifier of FIG. 1 using the measurement circuitry of FIGS. 2 and 4.

FIG. 10 is a flowchart representative of example machine-readable instructions and/or example operations 1000 that may be executed, instantiated, and/or performed by programmable circuitry and/or other hardware to determine a bias current of an input of the amplifier 105 of FIGS. 1-6 using the measurement circuitries 100 of FIG. 1, 200 of FIG. 2, and/or 400 of FIG. 4. The example machine-readable instructions and/or the example operations 1000 of FIG. 10 begin at block 1010, at which the switch 240 of FIGS. 2 and 4 couples the charge source circuitry 245 of FIGS. 2 and 4 to the integration circuitry 120 of FIGS. 1, 2, and 4. In some examples, the switch control circuitry 265 of FIG. 2 closes the switch 240 to couple the charge source circuitry 245 to the integration circuitry 120.

The charge source circuitry 245 supplies excess charges to the integration circuitry 120. (Block 1020). In some examples, the charge source circuitry 245 supplies the excess charges as an AC signal, such as a sinusoidal waveform, a square waveform, etc.

The switch 240 decouples the charge source circuitry 245 from the integration circuitry 120. (Block 1030). In some examples, the switch control circuitry 265 opens the switch 240 to decouple the charge source circuitry 245 to the integration circuitry 120.

The controller circuitry 135 of FIGS. 1, 2, and 4 determines a bias current. (Block 1040). Example operations to determine the bias current are described in FIG. 11, below.

The controller circuitry 135 determines if another measurement is needed. (Block 1050). If the controller circuitry 135 determines that another measurement is needed (e.g., Block 1050 returns a result of YES), control returns to Block 1010. If the controller circuitry 135 determines that another measurement is not needed (e.g., Block 1050 returns a result of NO), control proceeds to end.

Although example processes are described with reference to the flowchart illustrated in FIG. 10, many other methods determining a bias current of an input of the amplifier 105 using the measurement circuitries 100, 200, and/or 400 may alternatively be used in accordance with teachings of this disclosure. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 11:
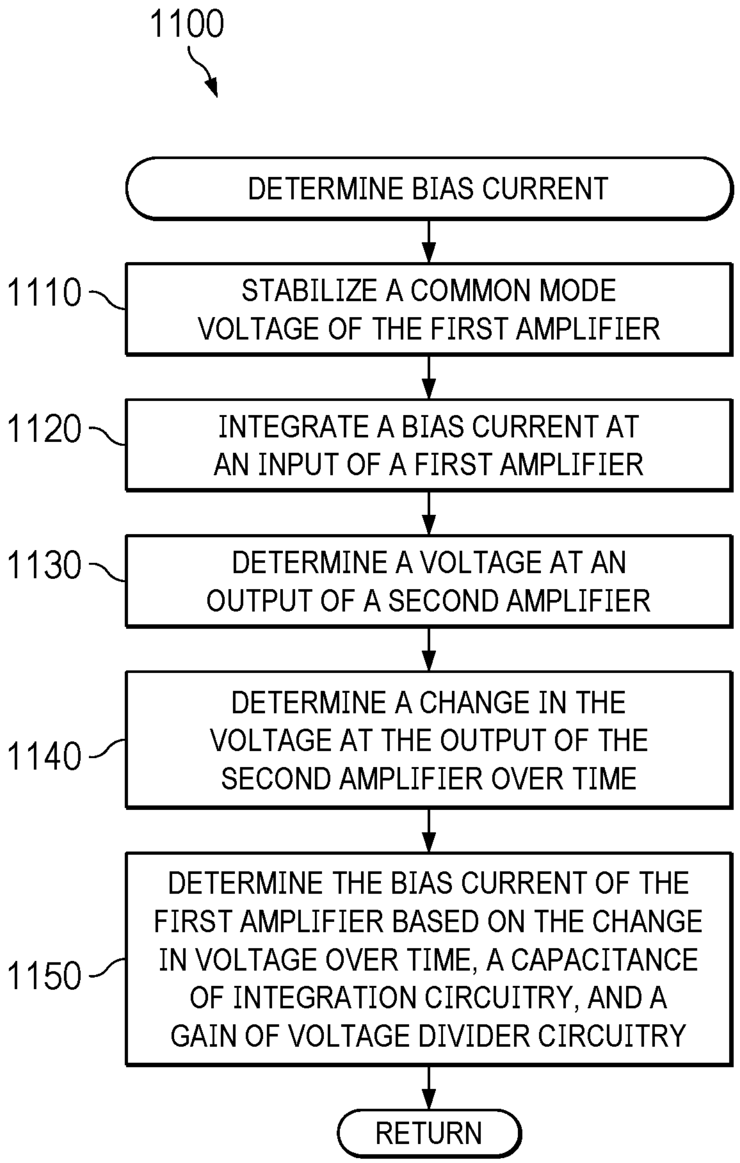
FIG. 11 is a flowchart representative of example machine-readable instructions and/or example operations that may be executed, instantiated, and/or performed using an example programmable circuitry and/or other hardware implementation of the measurement circuitry of FIGS. 1-6 to determine an input bias current of the amplifier of FIGS. 1-6.

FIG. 11 is a flowchart representative of example machine-readable instructions and/or example operations 1100 that may be executed, instantiated, and/or performed by programmable circuitry and/or other hardware to determine a bias current of the amplifier 105 of FIGS. 1-6 using the controller circuitry 135 of FIGS. 1, 2, and 4 and/or 320 of FIGS. 3 and 5. The example machine-readable instructions and/or the example operations 1100 of FIG. 11 begin at block 1110, at which he buffer circuitries 110 of FIGS. 1, 2, and 3 and/or 410 of FIGS. 4 and 5 stabilize the first amplifier 105. In some examples, the closed loop configuration of the buffer circuitries 110 and/or 410 allow the buffer circuitries 110 and/or 410 to compensate for the common mode voltage of the first amplifier 105.

The integration circuitry 120 of FIGS. 1, 2, and 4 and/or 305 of FIGS. 3 and 5 integrates a bias current at an input of the amplifier 105. (Block 1120) In some examples, the bias current of the amplifier 105 modifies a voltage difference across the integration circuitry 120 and/or 305.

The sampling circuitry 250 of FIGS. 2 and 3 determines a voltage at the output of the second amplifier 205 of FIGS. 2 and 3 and/or 430 of FIGS. 4 and 5. (Block 1130). In some examples, the sampling circuitry 250 samples the output of the second amplifier 205 and/or 430 to determine the voltage.

The voltage monitor circuitry 255 of FIGS. 2 and 3 determines a change in the voltage at the output of the second amplifier 205 and/or 430 over time $$\left(\frac{dV}{dt}\right).$$

(Block 1140). In some examples, the voltage monitor circuitry 255 divides a difference between two voltage measurements by a difference in time between the two voltage measurements.

The current determination circuitry 260 of FIGS. 2 and 3 calculates the bias current of the first amplifier 105 based on the change in the voltage over time, a capacitance (CAP) of the integration circuitries 120 and/or 305, and a gain (Gain) of the voltage divider circuitries 125 of FIGS. 1, 2, and 4 and/or 310 of FIGS. 3 and 5. (Block 1150). In some examples, the current determination circuitry 260 determines the bias current of the first amplifier 105 using Equation (1), above. Control proceeds to return.

Although example processes are described with reference to the flowchart illustrated in FIG. 11, many other methods of a bias current of the amplifier 105 using the controller circuitry 135 and/or 320 may alternatively be used in accordance with teachings of this disclosure. For example, the order of execution of the blocks may be changed, and/or some of the blocks described may be changed, eliminated, or combined. Similarly, additional operations may be included in the manufacturing process before, in between, or after the blocks shown in the illustrated examples.

While an example manner of implementing the controller circuitries 135 of FIGS. 1, 2, and 4 and 320 of FIG. 3 is illustrated in FIGS. 2 and 3, one or more of the elements, processes, and/or devices illustrated in FIGS. 2 and 3 may be combined, divided, re-arranged, omitted, eliminated, and/or implemented in any other way. Further, the example sampling circuitry 250 of FIG. 2, the example voltage monitor circuitry 255 of FIG. 2, the example current determination circuitry 260 of FIG. 2, and the example switch control circuitry 265 of FIG. 2, and/or, more generally, the example controller circuitry 135 of FIG. 2; and/or the example sampling circuitry 250, the example voltage monitor circuitry 255, the example current determination circuitry 260, and the example switch control circuitry 355 of FIG. 3 and/or, more generally, the example controller circuitry 320 of FIG. 3; may be implemented by hardware alone or by hardware in combination with software and/or firmware. Thus, for example, any of the example sampling circuitry 250 of FIG. 2, the example voltage monitor circuitry 255 of FIG. 2, the example current determination circuitry 260 of FIG. 2, and the example switch control circuitry 265 of FIG. 2, and/or, more generally, the example controller circuitry 135 of FIG. 2; and/or the example sampling circuitry 250, the example voltage monitor circuitry 255, the example current determination circuitry 260, and the example switch control circuitry 355 of FIG. 3 and/or, more generally, the example controller circuitry 320 of FIG. 3; could be implemented by programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example controller circuitries 135 and 320 of FIGS. 1-5 may include one or more elements, processes, and/or devices in addition to, or instead of, those illustrated in FIGS. 2 and 3, and/or may include more than one of any or all of the illustrated elements, processes and devices.

Flowchart(s) representative of example machine-readable instructions, which may be executed by programmable circuitry to implement and/or instantiate the controller circuitries 135 and 320 of FIGS. 1-5 and/or representative of example operations which may be performed by programmable circuitry and/or other hardware to implement and/or instantiate the controller circuitries 135 and 320 of FIGS. 1-5, are shown in FIGS. 9, 10, and/or 11. The machine-readable instructions may be one or more executable programs or portion(s) of one or more executable programs for execution by programmable circuitry such as the processor circuitry 1212 shown in the example processor platform 1200 described below in connection with FIG. 12 and/or may be one or more function(s) or portion(s) of functions to be performed by the example programmable circuitry (e.g., an FPGA) described below in connection with FIGS. 13 and/or 14. In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 9, 10, and/or 11, many other methods of implementing the example controller circuitries 135 and 320 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine-readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable, computer readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 9, 10, and/or 11 may be implemented using executable instructions (e.g., computer readable and/or machine-readable instructions) stored on one or more non-transitory computer readable and/or machine-readable media. As used herein, the terms non-transitory computer readable medium, non-transitory computer readable storage medium, non-transitory machine-readable medium, and/or non-transitory machine-readable storage medium are expressly defined to include any type of computer readable storage device and/or storage disk and to exclude propagating signals and to exclude transmission media. Examples of such non-transitory computer readable medium, non-transitory computer readable storage medium, non-transitory machine-readable medium, and/or non-transitory machine-readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms “non-transitory computer readable storage device” and “non-transitory machine-readable storage device” are defined to include any physical (mechanical, magnetic and/or electrical) hardware to retain information for a time period, but to exclude propagating signals and to exclude transmission media. Examples of non-transitory computer readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term “device” refers to physical structure such as mechanical and/or electrical equipment, hardware, and/or circuitry that may or may not be configured by computer readable instructions, machine-readable instructions, etc., and/or manufactured to execute computer-readable instructions, machine-readable instructions, etc.

“Including” and “comprising” (and all forms and tenses thereof) are used herein to be open ended terms. Thus, whenever a claim employs any form of “include” or “comprise” (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase “at least” is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 12:
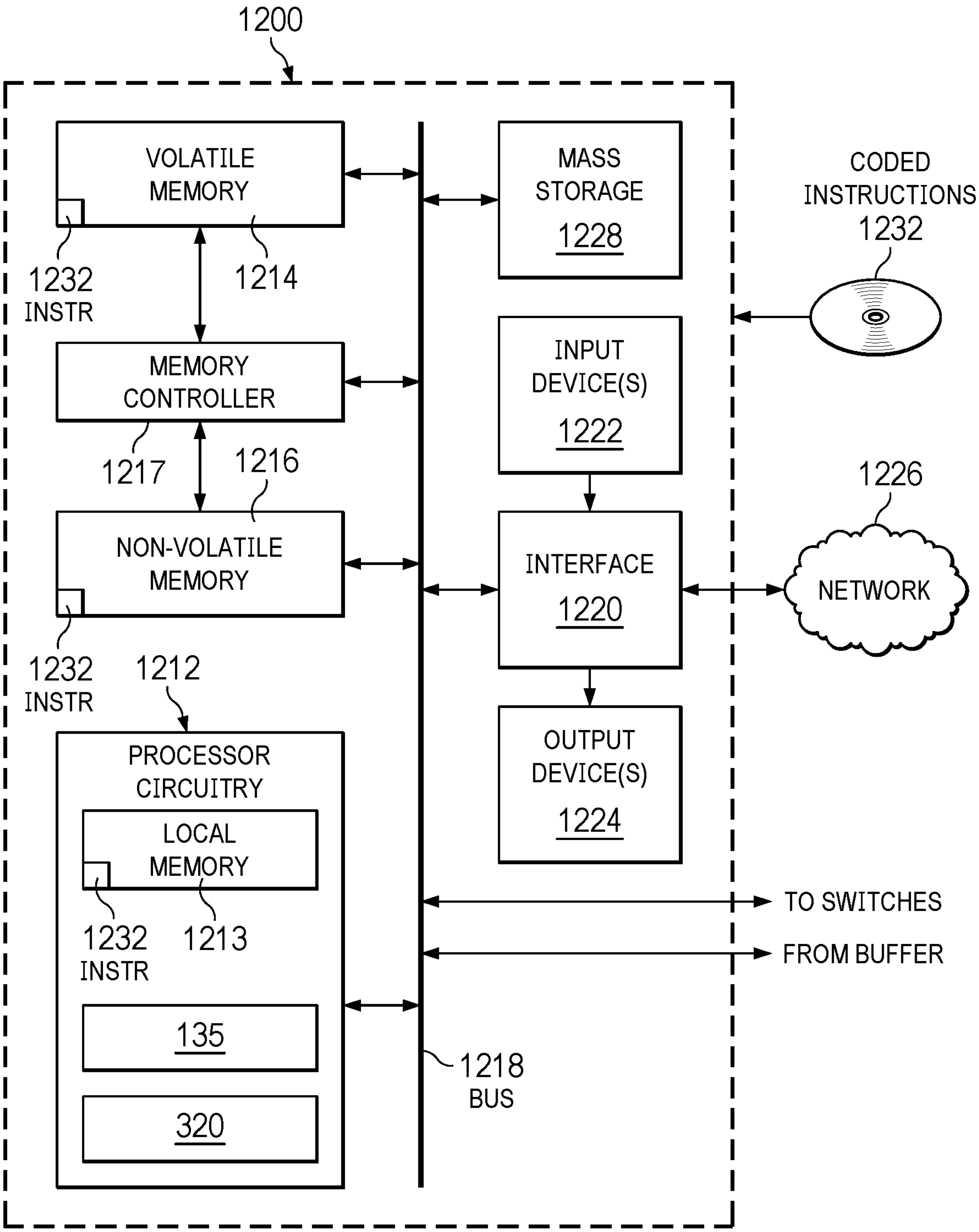
FIG. 12 is a block diagram of an example processing platform including programmable circuitry structured to execute, instantiate, and/or perform the example machine-readable instructions and/or perform one or more of the example operations of FIGS. 9-11 to implement the measurement circuitry of FIGS. 1-5.

FIG. 12 is a block diagram of an example programmable circuitry platform 1200 structured to execute and/or instantiate the example machine-readable instructions and/or one or more of the example operations of FIGS. 9, 10, and/or 11 to implement the controller circuitries 135 of FIGS. 1, 2, and 4, and 320 of FIGS. 3 and 5. The programmable circuitry platform 1200 can be, for example, a server, a personal computer, a workstation, a self-learning machine (e.g., a neural network), or any other type of computing and/or electronic device.

The programmable circuitry platform 1200 of the illustrated example includes programmable circuitry 1212. The programmable circuitry 1212 of the illustrated example is hardware. For example, the programmable circuitry 1212 can be implemented by one or more integrated circuits, logic circuits, FPGAs, microprocessors, CPUs, GPUs, DSPs, and/or microcontrollers from any desired family or manufacturer. The programmable circuitry 1212 may be implemented by one or more semiconductor based (e.g., silicon based) devices. In this example, the programmable circuitry 1212 implements the example sampling circuitry 250 of FIG. 2, the example voltage monitor circuitry 255 of FIG. 2, the example current determination circuitry 260 of FIG. 2, and the example switch control circuitry 265 of FIG. 2, and/or, more generally, the example controller circuitry 135 of FIGS. 1, 2, and/or 4; and/or the example sampling circuitry 250, the example voltage monitor circuitry 255, the example current determination circuitry 260, and the example switch control circuitry 355 of FIG. 3 and/or, more generally, the example controller circuitry 320 of FIGS. 3 and 5.

The programmable circuitry 1212 of the illustrated example includes a local memory 1213 (e.g., a cache, registers, etc.). The programmable circuitry 1212 of the illustrated example is in communication with main memory 1214, 1216, which includes a volatile memory 1213 and a non-volatile memory 1216, by a bus 1218. The volatile memory 1213 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1216 may be implemented by flash memory and/or any other desired type of memory device. Access to the main memory 1214, 1216 of the illustrated example is controlled by a memory controller 1217. In some examples, the memory controller 1217 may be implemented by one or more integrated circuits, logic circuits, microcontrollers from any desired family or manufacturer, or any other type of circuitry to manage the flow of data going to and from the main memory 1214, 1216.

The programmable circuitry platform 1200 of the illustrated example also includes interface circuitry 1220. The interface circuitry 1220 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1222 are connected to the interface circuitry 1220. The input device(s) 1222 permit(s) a user (e.g., a human user, a machine user, etc.) to enter data and/or commands into the programmable circuitry 1212. The input device(s) 1222 can be implemented by, for example, a keyboard, a button, a mouse, a touchscreen, a trackpad, a trackball, and/or an isopoint device.

One or more output devices 1224 are also connected to the interface circuitry 1220 of the illustrated example. The output device(s) 1224 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), and/or a printer. The interface circuitry 1220 of the illustrated example, thus, typically includes a graphics driver card, a graphics driver chip, and/or graphics processor circuitry such as a GPU.

The interface circuitry 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a beyond-line-of-site wireless system, a line-of-site wireless system, a cellular telephone system, an optical connection, etc.

The programmable circuitry platform 1200 of the illustrated example also includes one or more mass storage discs or devices 1228 to store firmware, software, and/or data. Examples of such mass storage discs or devices 1228 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 1232, which may be implemented by the machine-readable instructions of FIGS. 9, 10, and/or 11, may be stored in the mass storage device 1228, in the volatile memory 1214, in the non-volatile memory 1216, and/or on at least one non-transitory computer readable storage medium such as a CD or DVD which may be removable.

Figure 13:
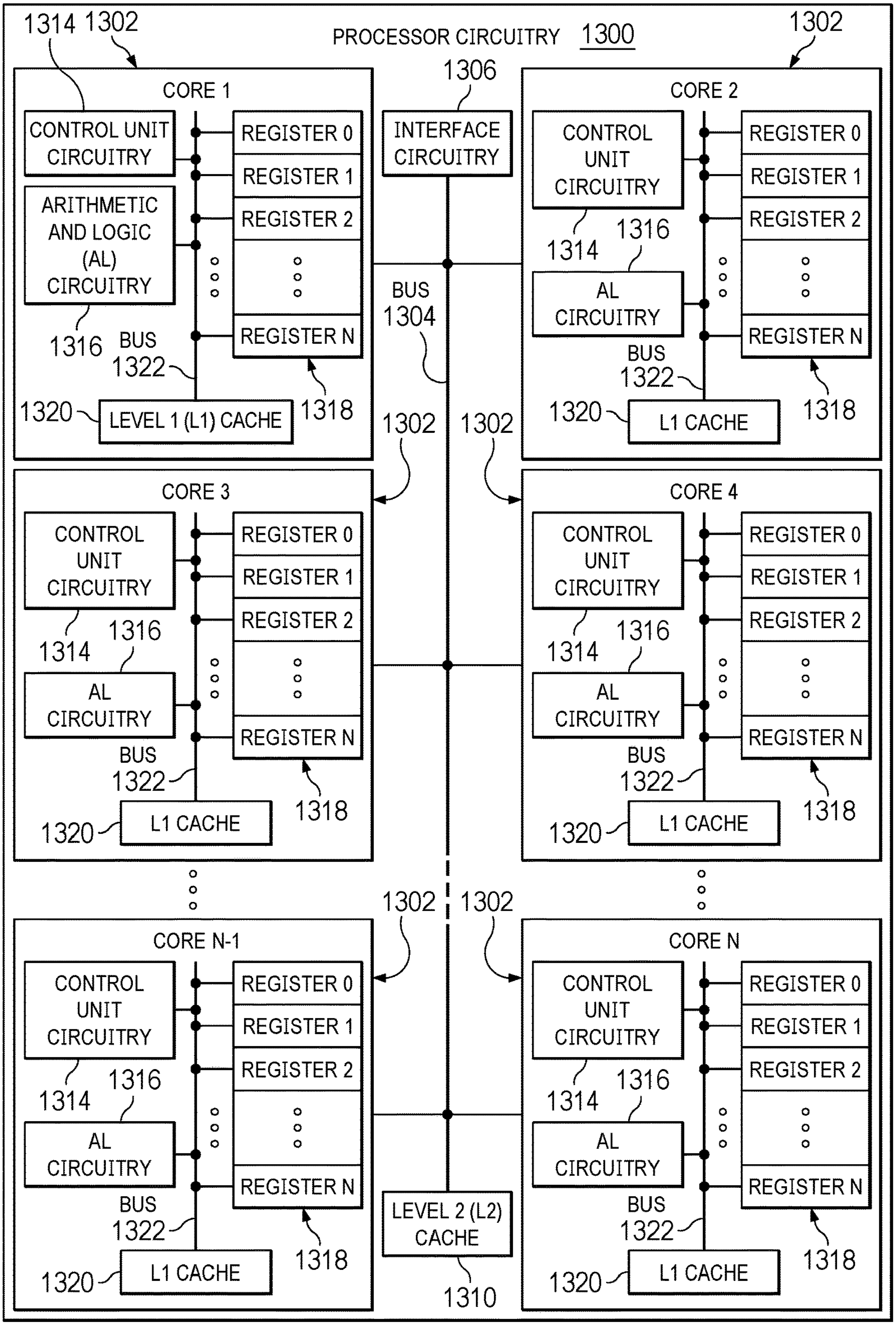
FIG. 13 is a block diagram of an example implementation of the programmable circuitry of FIG. 12.

FIG. 13 is a block diagram of an example implementation of the programmable circuitry 1212 of FIG. 13. In this example, the programmable circuitry 1212 of FIG. 12 is implemented by a microprocessor 1300. For example, the microprocessor 1300 may be a general-purpose microprocessor (e.g., general-purpose microprocessor circuitry). The microprocessor 1300 executes some or all of the machine-readable instructions of the flowcharts of FIGS. 9, 10, and/or 11 to effectively instantiate the controller circuitries 135 of FIGS. 1, 2, and 4, and/or 320 of FIGS. 3 and 5 as logic circuits to perform operations corresponding to those machine-readable instructions. In some such examples, the controller circuitries 135 of FIGS. 1, 2, and 4, and/or 320 of FIGS. 3 and 5 is instantiated by the hardware circuits of the microprocessor 1300 in combination with the machine-readable instructions. For example, the microprocessor 1300 may be implemented by multi-core hardware circuitry such as a CPU, a DSP, a GPU, an XPU, etc. Although it may include any number of example cores 1302 (e.g., 1 core), the microprocessor 1300 of this example is a multi-core semiconductor device including N cores. The cores 1302 of the microprocessor 1300 may operate independently or may cooperate to execute machine-readable instructions. For example, machine code corresponding to a firmware program, an embedded software program, or a software program may be executed by one of the cores 1302 or may be executed by multiple ones of the cores 1302 at the same or different times. In some examples, the machine code corresponding to the firmware program, the embedded software program, or the software program is split into threads and executed in parallel by two or more of the cores 1302. The software program may correspond to a portion or all of the machine-readable instructions and/or operations represented by the flowcharts of FIGS. 9, 10, and/or 11.

The cores 1302 may communicate by a first example bus 1304. In some examples, the first bus 1304 may be implemented by a communication bus to effectuate communication associated with one(s) of the cores 1302. For example, the first bus 1304 may be implemented by at least one of an Inter-Integrated Circuit (I2C) bus, a Serial Peripheral Interface (SPI) bus, a PCI bus, or a PCIe bus. Additionally or alternatively, the first bus 1304 may be implemented by any other type of computing or electrical bus. The cores 1302 may obtain data, instructions, and/or signals from one or more external devices by example interface circuitry 1306. The cores 1302 may output data, instructions, and/or signals to the one or more external devices by the interface circuitry 1306. Although the cores 1302 of this example include example local memory 1320 (e.g., Level 1 (L1) cache that may be split into an L1 data cache and an L1 instruction cache), the microprocessor 1300 also includes example shared memory 1310 that may be shared by the cores (e.g., Level 2 (L2 cache)) for high-speed access to data and/or instructions. Data and/or instructions may be transferred (e.g., shared) by writing to and/or reading from the shared memory 1310. The local memory 1320 of each of the cores 1302 and the shared memory 1310 may be part of a hierarchy of storage devices including multiple levels of cache memory and the main memory (e.g., the main memory 1214, 1216 of FIG. 12). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1302 may be referred to as a CPU, DSP, GPU, etc., or any other type of hardware circuitry. Each core 1302 includes control unit circuitry 1314, arithmetic and logic (AL) circuitry (sometimes referred to as an ALU) 1316, a plurality of registers 1318, the local memory 1320, and a second example bus 1322. Other structures may be present. For example, each core 1302 may include vector unit circuitry, single instruction multiple data (SIMD) unit circuitry, load/store unit (LSU) circuitry, branch/jump unit circuitry, floating-point unit (FPU) circuitry, etc. The control unit circuitry 1314 includes semiconductor-based circuits structured to control (e.g., coordinate) data movement within the corresponding core 1302. The AL circuitry 1316 includes semiconductor-based circuits structured to perform one or more mathematic and/or logic operations on the data within the corresponding core 1302. The AL circuitry 1316 of some examples performs integer-based operations. In other examples, the AL circuitry 1316 also performs floating-point operations. In yet other examples, the AL circuitry 1316 may include first AL circuitry that performs integer-based operations and second AL circuitry that performs floating-point operations. In some examples, the AL circuitry 1316 may be referred to as an Arithmetic Logic Unit (ALU).

The registers 1318 are semiconductor-based structures to store data and/or instructions such as results of one or more of the operations performed by the AL circuitry 1316 of the corresponding core 1302. For example, the registers 1318 may include vector register(s), SIMD register(s), general-purpose register(s), flag register(s), segment register(s), machine-specific register(s), instruction pointer register(s), control register(s), debug register(s), memory management register(s), machine check register(s), etc. The registers 1318 may be arranged in a bank as shown in FIG. 13. Alternatively, the registers 1318 may be organized in any other arrangement, format, or structure, such as by being distributed throughout the core 1302 to shorten access time. The second bus 1322 may be implemented by at least one of an I2C bus, a SPI bus, a PCI bus, or a PCIe bus.

Each core 1302 and/or, more generally, the microprocessor 1300 may include additional and/or alternative structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1300 is a semiconductor device fabricated to include many transistors interconnected to implement the structures described above in one or more integrated circuits (ICs) contained in one or more packages.

The microprocessor 1300 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those described herein. A GPU, DSP and/or other programmable device can also be an accelerator. Accelerators may be on-board the microprocessor 1300, in the same chip package as the microprocessor 1300 and/or in one or more separate packages from the microprocessor 1300.

Figure 14:
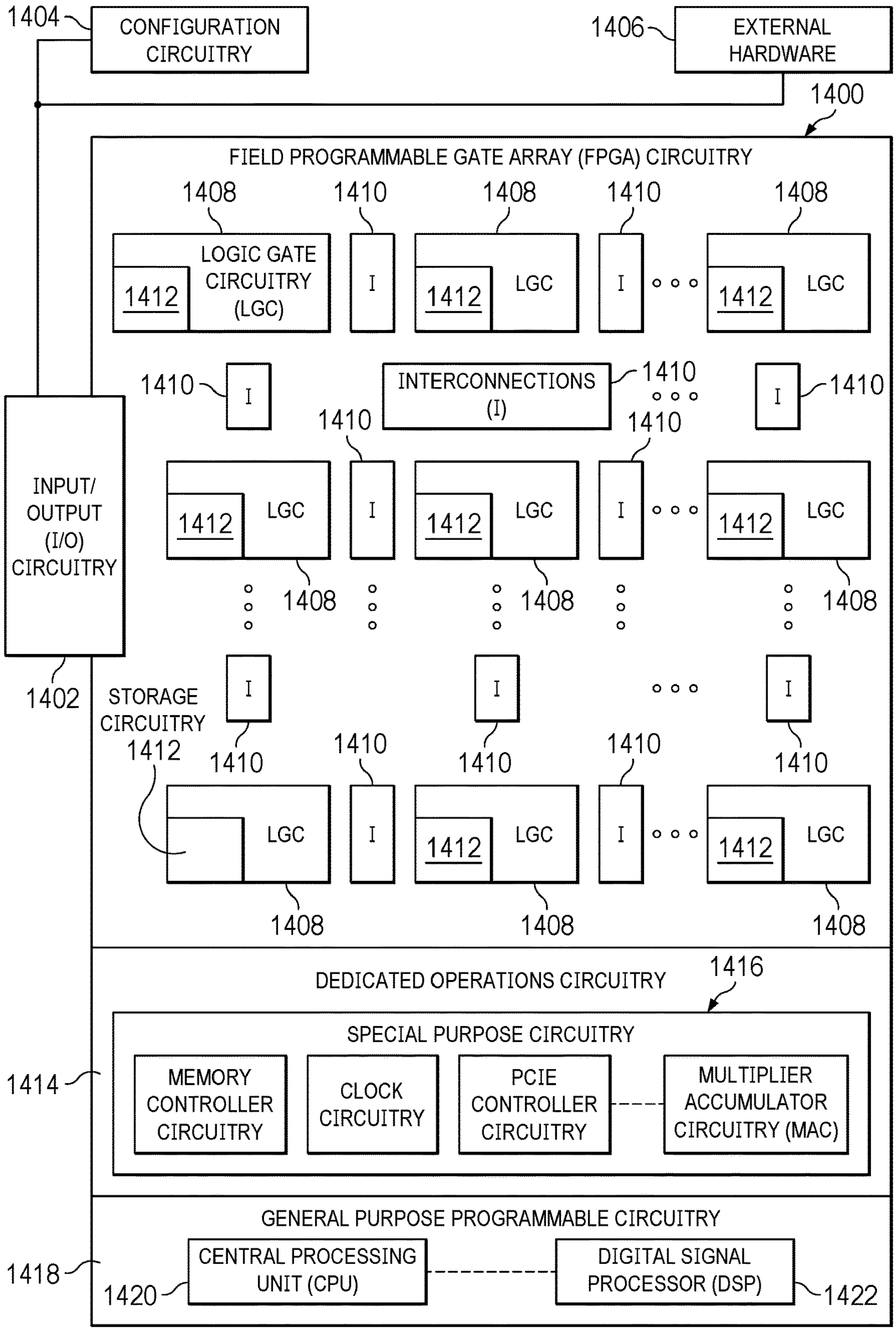
FIG. 14 is a block diagram of another example implementation of the programmable circuitry of FIG. 12.

FIG. 14 is a block diagram of another example implementation of the programmable circuitry 1212 of FIG. 12. In this example, the programmable circuitry 1212 is implemented by FPGA circuitry 1400. For example, the FPGA circuitry 1400 may be implemented by an FPGA. The FPGA circuitry 1400 can be used, for example, to perform operations that could otherwise be performed by the example microprocessor 1300 of FIG. 13 executing corresponding machine-readable instructions. However, once configured, the FPGA circuitry 1400 instantiates the operations and/or functions corresponding to the machine-readable instructions in hardware and, thus, can often execute the operations/functions faster than they could be performed by a general-purpose microprocessor executing the corresponding software.

More specifically, in contrast to the microprocessor 1300 of FIG. 13 described above (which is a general purpose device that may be programmed to execute some or all of the machine-readable instructions represented by the flowchart(s) of FIGS. 9, 10, and/or 11 but whose interconnections and logic circuitry are fixed once fabricated), the FPGA circuitry 1400 of the example of FIG. 14 includes interconnections and logic circuitry that may be configured, structured, programmed, and/or interconnected in different ways after fabrication to instantiate, for example, some or all of the operations/functions corresponding to the machine-readable instructions represented by the flowchart(s) of FIGS. 9, 10, and/or 11. In particular, the FPGA circuitry 1400 may be thought of as an array of logic gates, interconnections, and switches. The switches can be programmed to change how the logic gates are interconnected by the interconnections, effectively forming one or more dedicated logic circuits (unless and until the FPGA circuitry 1400 is reprogrammed). The configured logic circuits enable the logic gates to cooperate in different ways to perform different operations on data received by input circuitry. Those operations may correspond to some or all of the instructions (e.g., the software and/or firmware) represented by the flowchart(s) of FIGS. 9, 10, and/or 11. As such, the FPGA circuitry 1400 may be configured and/or structured to effectively instantiate some or all of the operations/functions corresponding to the machine-readable instructions of the flowchart(s) of FIGS. 9, 10, and/or 11 as dedicated logic circuits to perform the operations/functions corresponding to those software instructions in a dedicated manner analogous to an ASIC. Therefore, the FPGA circuitry 1400 may perform the operations/functions corresponding to the some or all of the machine-readable instructions of FIGS. 9, 10, and/or 11 faster than the general-purpose microprocessor can execute the same.

In the example of FIG. 14, the FPGA circuitry 1400 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 1400 of FIG. 14 may access and/or load the binary file to cause the FPGA circuitry 1400 of FIG. 14 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1400 of FIG. 14 to cause configuration and/or structuring of the FPGA circuitry 1400 of FIG. 14, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 1400 of FIG. 14 may access and/or load the binary file to cause the FPGA circuitry 1400 of FIG. 14 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1400 of FIG. 14 to cause configuration and/or structuring of the FPGA circuitry 1400 of FIG. 14, or portion(s) thereof.

The FPGA circuitry 1400 of FIG. 14, includes example input/output (I/O) circuitry 1402 to obtain and/or output data to/from example configuration circuitry 1404 and/or external hardware 1406. For example, the configuration circuitry 1404 may be implemented by interface circuitry that may obtain a binary file, which may be implemented by a bit stream, data, and/or machine-readable instructions, to configure the FPGA circuitry 1400, or portion(s) thereof. In some such examples, the configuration circuitry 1404 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 1406 may be implemented by external hardware circuitry. For example, the external hardware 1406 may be implemented by the microprocessor 1300 of FIG. 13.

The FPGA circuitry 1400 also includes an array of example logic gate circuitry 1408, a plurality of example configurable interconnections 1410, and example storage circuitry 1412. The logic gate circuitry 1408 and the configurable interconnections 1410 are configurable to instantiate one or more operations/functions that may correspond to at least some of the machine-readable instructions of FIGS. 9, 10, and/or 11 and/or other desired operations. The logic gate circuitry 1408 shown in FIG. 14 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1408 to enable configuration of the electrical structures and/or the logic gates to form circuits to perform desired operations/functions. The logic gate circuitry 1408 may include other electrical structures such as look-up tables (LUTs), registers (e.g., flip-flops or latches), multiplexers, etc.

The configurable interconnections 1410 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1408 to program desired logic circuits.

The storage circuitry 1412 of the illustrated example is structured to store result(s) of the one or more of the operations performed by corresponding logic gates. The storage circuitry 1412 may be implemented by registers or the like. In the illustrated example, the storage circuitry 1412 is distributed amongst the logic gate circuitry 1408 to facilitate access and increase execution speed.

The example FPGA circuitry 1400 of FIG. 14 also includes example dedicated operations circuitry 1414. In this example, the dedicated operations circuitry 1414 includes special purpose circuitry 1416 that may be invoked to implement commonly used functions to avoid the need to program those functions in the field. Examples of such special purpose circuitry 1416 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1400 may also include example general purpose programmable circuitry 1418 such as an example CPU 1420 and/or an example DSP 1422. Other general purpose programmable circuitry 1418 may additionally or alternatively be present such as a GPU, an XPU, etc., that can be programmed to perform other operations.

Although FIGS. 13 and 14 illustrate two example implementations of the programmable circuitry 1212 of FIG. 12, many other approaches are contemplated. For example, FPGA circuitry may include an on-board CPU, such as one or more of the example CPU 1420 of FIG. 14. Therefore, the programmable circuitry 1212 of FIG. 12 may additionally be implemented by combining at least the example microprocessor 1300 of FIG. 13 and the example FPGA circuitry 1400 of FIG. 15. In some such hybrid examples, one or more cores 1302 of FIG. 13 may execute a first portion of the machine-readable instructions represented by the flowchart(s) of FIGS. 9, 10, and/or 11 to perform first operation(s)/function(s), the FPGA circuitry 1400 of FIG. 14 may be configured and/or structured to perform second operation(s)/function(s) corresponding to a second portion of the machine-readable instructions represented by the flowcharts of FIGS. 10, 11, and/or 12, and/or an ASIC may be configured and/or structured to perform third operation(s)/function(s) corresponding to a third portion of the machine-readable instructions represented by the flowcharts of FIGS. 9, 10, and/or 11.

It should be understood that some or all of the controller circuitries 135 of FIGS. 1, 2, and 4, and/or 320 of FIGS. 3 and 5 may, thus, be instantiated at the same or different times. For example, same and/or different portion(s) of the microprocessor 1300 of FIG. 13 may be programmed to execute portion(s) of machine-readable instructions at the same and/or different times. In some examples, same and/or different portion(s) of the FPGA circuitry 1400 of FIG. 14 may be configured and/or structured to perform operations/functions corresponding to portion(s) of machine-readable instructions at the same and/or different times.

In some examples, some or all of the controller circuitries 135 of FIGS. 1, 2, and 4, and/or 320 of FIGS. 3 and 5 may be instantiated, for example, in one or more threads executing concurrently and/or in series. For example, the microprocessor 1300 of FIG. 13 may execute machine-readable instructions in one or more threads executing concurrently and/or in series. In some examples, the FPGA circuitry 1400 of FIG. 14 may be configured and/or structured to carry out operations/functions concurrently and/or in series. Moreover, in some examples, some or all of the controller circuitries 135 of FIGS. 1, 2, and 4, and/or 320 of FIGS. 3 and 5 may be implemented within one or more virtual machines and/or containers executing on the microprocessor 1300 of FIG. 14.

In some examples, the programmable circuitry 1212 of FIG. 12 may be in one or more packages. For example, the microprocessor 1300 of FIG. 13 and/or the FPGA circuitry 1400 of FIG. 14 may be in one or more packages. In some examples, an XPU may be implemented by the programmable circuitry 1212 of FIG. 12, which may be in one or more packages. For example, the XPU may include a CPU (e.g., the microprocessor 1300 of FIG. 13, the CPU 1420 of FIG. 14, etc.) in one package, a DSP (e.g., the DSP 1422 of FIG. 14) in another package, a GPU in yet another package, and an FPGA (e.g., the FPGA circuitry 1400 of FIG. 14) in still yet another package.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term “integrated circuit” means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase “ground” in the foregoing description include a chassis ground, an Earth ground, a floating ground, a virtual ground, a digital ground, a common ground, and/or any other form of ground connection applicable to, or suitable for, the teachings of this description. Unless otherwise stated, “about,” “approximately,” or “substantially” preceding a value means +/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that determine a bias current of an amplifier. Described systems, apparatus, articles of manufacture, and methods improve the efficiency, precision, and accuracy of determining an input bias current of an amplifier. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:

an amplifier having an input and an output;

feedback circuitry having a first terminal and a second terminal, the first terminal of the feedback circuitry directly connected to the input of the amplifier, the second terminal of the feedback circuitry directly connected to the output of the amplifier;

voltage divider circuitry having a first terminal and a second terminal, the first terminal of the voltage divider circuitry directly connected to the output of the amplifier;

a capacitor having a first terminal directly connected to the second terminal of the voltage divider circuitry; and charge injection circuitry coupled to the first terminal of the capacitor and to the second terminal of the voltage divider circuitry.

2. The apparatus of claim 1, wherein the capacitor is a first capacitor, the feedback circuitry includes:

a resistor having a first terminal and a second terminal, the first terminal of the resistor coupled to the output of the amplifier; and a second capacitor having a first terminal and a second terminal, the first terminal of the second capacitor coupled to the second terminal of the resistor, the second terminal of the second capacitor coupled to the input of the amplifier.

3. The apparatus of claim 1, wherein the capacitor is a first capacitor, the feedback circuitry includes:

a second capacitor having a first terminal and a second terminal, the first terminal of the second capacitor coupled to the output of the amplifier, the second terminal of the second capacitor coupled to the input of the amplifier; and a resistor having a first terminal and a second terminal, the first terminal of the resistor coupled to the second terminal of the second capacitor and the input of the amplifier, the second terminal of the resistor coupled to a voltage reference terminal.

4. The apparatus of claim 1, wherein the charge injection circuitry includes:

a switch having a first terminal and a second terminal, the first terminal of the switch coupled to the first terminal of the capacitor and the second terminal of the voltage divider circuitry; and charge source circuitry coupled to the second terminal of the switch.

5. The apparatus of claim 1, further comprising:

a first switch having a first terminal and a second terminal, the first terminal of the first switch coupled to the output of the amplifier, the second terminal of the first switch coupled to the input of the amplifier;

a second switch having a first terminal and a second terminal, the first terminal of the second switch coupled to the second terminal of the voltage divider circuitry, the second terminal of the second switch coupled to a common terminal; and a third switch having a first terminal and a second terminal, the first terminal of the third switch coupled to the first terminal of the capacitor, the second terminal of the third switch coupled to a reference voltage.

6. The apparatus of claim 1, further comprising controller circuitry including:

sampling circuitry having a first terminal and a second terminal, the first terminal of the sampling circuitry coupled to the output of the amplifier;

voltage monitor circuitry having a first terminal and a second terminal, the first terminal of the voltage monitor circuitry coupled to the second terminal of the sampling circuitry; and current determination circuitry having a terminal coupled to the second terminal of the voltage monitor circuitry.

7. A system comprising:

a first amplifier having an input;

a second amplifier having an inverting input and an output;

feedback circuitry having a first terminal and a second terminal, the first terminal of the feedback circuitry coupled to the output of the second amplifier, the second terminal of the feedback circuitry coupled to the inverting input of the second amplifier;

voltage divider circuitry having a first terminal and a second terminal, the first terminal of the voltage divider circuitry coupled to the output of the second amplifier;

a capacitor having a first terminal and a second terminal, the first terminal of the capacitor coupled to the input of the first amplifier, the second terminal of the capacitor coupled to the second terminal of the voltage divider circuitry; and charge injection circuitry coupled to the second terminal of the capacitor and the second terminal of the voltage divider circuitry.

8. The system of claim 7, further comprising controller circuitry including:

sampling circuitry having a first terminal and a second terminal, the first terminal of the sampling circuitry coupled to the output of the second amplifier;

voltage monitor circuitry having a first terminal and a second terminal, the first terminal of the voltage monitor circuitry coupled to the second terminal of the sampling circuitry; and current determination circuitry having a terminal coupled to the second terminal of the voltage monitor circuitry.

9. The system of claim 7, wherein the capacitor is a first capacitor, the feedback circuitry includes:

a resistor having a first terminal and a second terminal, the first terminal of the resistor coupled to the output of the second amplifier; and a second capacitor having a first terminal and a second terminal, the first terminal of the second capacitor coupled to the second terminal of the resistor, the second terminal of the second capacitor coupled to the input of the second amplifier.

10. The system of claim 7, wherein the capacitor is a first capacitor, the feedback circuitry includes:

a second capacitor having a first terminal and a second terminal, the first terminal of the second capacitor coupled to the output of the second amplifier, the second terminal of the second capacitor coupled to the input of the second amplifier; and a resistor having a first terminal and a second terminal, the first terminal of the resistor coupled to the second terminal of the second capacitor and the input of the second amplifier, the second terminal coupled to a voltage reference terminal.

11. The system of claim 7, wherein the charge injection circuitry includes:

a switch having a first terminal and a second terminal, the first terminal of the switch coupled to the second terminal of the capacitor and the second terminal of the voltage divider circuitry; and charge source circuitry coupled to the second terminal of the switch.

12. The system of claim 7, further comprising:

a first switch having a first terminal and a second terminal, the first terminal of the first switch configured to be coupled to the output of the second amplifier, the second terminal of the first switch coupled to the input of the second amplifier;

a second switch having a first terminal and a second terminal, the first terminal of the second switch coupled to the second terminal of the voltage divider circuitry, the second terminal of the second switch coupled to a common potential; and a third switch having a first terminal and a second terminal, the first terminal of the third switch coupled to the second terminal of the capacitor, the second terminal of the third switch coupled to a reference voltage.

13. A method comprising:

measuring, by sampling circuitry, a voltage at an output of a first amplifier;

determining, by voltage monitor circuitry, a change in the voltage at the output of the first amplifier over time; and calculating, by current determination circuitry, a bias current of a second amplifier based on the change in the voltage at the output of the first amplifier over time, a gain of voltage divider circuitry, and a capacitance of integration circuitry.

14. The method of claim 13, further comprising stabilizing, by the first amplifier and feedback circuitry, the second amplifier.

15. The method of claim 13, further comprising coupling an input of the first amplifier to the output of the first amplifier.

16. The method of claim 13, further comprising integrating the bias current of the second amplifier using the integration circuitry.

17. The method of claim 16, further comprising supplying excess charge to the integration circuitry to reduce variations in a direct current (DC) offset of the voltage at a reference voltage.

18. The method of claim 13, wherein the calculating of the bias current includes multiplying the change in the voltage at the output of the first amplifier over time by a division of the capacitance of the integration circuitry by the gain of the voltage divider circuitry.

19. A method comprising:

determining, by sampling circuitry, a voltage at an output of a first amplifier;

determining, by voltage monitor circuitry, a change in the voltage at the output of the first amplifier over time; and determining, by current determination circuitry, a bias current of a second amplifier based on the change in the voltage at the output of the first amplifier over time, a gain of voltage divider circuitry, and a capacitance of integration circuitry.

20. The method of claim 19, further comprising stabilizing, by the first amplifier and feedback circuitry, the second amplifier.

21. The method of claim 19, further comprising coupling an input of the first amplifier to the output of the first amplifier.

22. The method of claim 19, further comprising integrating the bias current of the second amplifier using the integration circuitry.

23. The method of claim 22, further comprising supplying excess charge to the integration circuitry to reduce variations in a direct current (DC) offset of the voltage at a reference voltage.

24. The method of claim 19, wherein the determining of the bias current includes multiplying the change in the voltage at the output of the first amplifier over time by a quantity determined by dividing the capacitance of the integration circuitry by the gain of the voltage divider circuitry.

* * * * *